United States Patent
Kobayashi

(10) Patent No.: US 6,803,175 B2
(45) Date of Patent: Oct. 12, 2004

(54) METHOD OF PRODUCING PATTERN-FORMED STRUCTURE AND PHOTOMASK USED IN THE SAME

(75) Inventor: Hironori Kobayashi, Tokyo (JP)

(73) Assignee: Dai Nippon Printing Co., Ltd., Tokyo (JP)

(*) Notice: Subject to any disclaimer, the term of this patent is extended or adjusted under 35 U.S.C. 154(b) by 0 days.

(21) Appl. No.: 10/108,796

(22) Filed: Mar. 28, 2002

(65) Prior Publication Data

US 2003/0008217 A1 Jan. 9, 2003

(30) Foreign Application Priority Data

Mar. 29, 2001 (JP) ........................ 2001-096012
Nov. 20, 2001 (JP) ........................ 2001-355410
Jan. 30, 2002 (JP) ........................ 2002-020947

(51) Int. Cl.$^7$ ............... G03F 7/00; B05D 3/00
(52) U.S. Cl. ............... 430/322; 430/201; 430/311; 430/5; 502/2; 502/5; 101/465
(58) Field of Search ............... 430/5, 322, 201, 430/947, 200; 502/2, 5; 101/465, 463.1

(56) References Cited

U.S. PATENT DOCUMENTS

2003/0059686 A1 * 3/2003 Kobayashi et al. ............ 430/5
2003/0087073 A1 * 5/2003 Kobayashi ................. 428/209

FOREIGN PATENT DOCUMENTS

| EP | 0932081 | 7/1999 |
| JP | 2000-249821 | 9/2000 |
| JP | 20002284468 | 10/2000 |

* cited by examiner

*Primary Examiner*—Mark F. Huff
*Assistant Examiner*—Kripa Sagar
(74) *Attorney, Agent, or Firm*—Timothy J. Keefer; Seyfarth Shaw LLP

(57) ABSTRACT

A method of producing a pattern-formed structure, comprising: preparing a substrate for a pattern-formed structure having a characteristic-modifiable layer whose characteristic at a surface thereof can be modified by the action of photocatalyst; preparing a photocatalyst-containing-layer side substrate having a photocatalyst-containing layer formed on a base material, the photocatalyst-containing layer containing photocatalyst; arranging the substrate for a pattern-formed structure and the photocatalyst-containing-layer side substrate such that the characteristic-modifiable layer faces the photocatalyst-containing layer with a clearance of no larger than 200 μm therebetween; and irradiating energy to the characteristic-modifiable layer from a predetermined direction, and modifying characteristic of a surface of the characteristic-modifiable layer, thereby forming a pattern at the characteristic-modifiable layer.

26 Claims, 3 Drawing Sheets

METHOD OF PRODUCING PATTERN-FORMED STRUCTURE AND PHOTOMASK USED IN THE SAME

BACKGROUND OF THE INVENTION

The present invention relates to a method of producing a pattern-formed structure, which structure is less likely to deteriorate as time elapses after the characteristic thereof is modified by using a photocatalyst, because no pyotocatalyst exists in the resulting pattern-formed structure. The present invention also relates to a photomask which can be used in the aforementioned method of producing a pattern-formed structure.

As the conventional method of forming a highly elaborate pattern, is generally known a method of producing a pattern-formed structure by photolithography, such as a method which includes the processes of: carrying out pattern-exposure of a photoresist layer provided by coating on a base material; developing the photoresist after the exposure; and effecting etching of the developed photoresist layer, and a method which includes the processes of: employing a functional substance as the photoresist; and directly forming the aimed pattern by exposure of the photoresist.

The methods of forming a highly elaborate pattern by lithography have already been employed in formation of a colored pattern of a color filter used in a liquid crystal display or the like, formation of a microlens, production of an elaborate electric circuit board, production of a chrome mask used for pattern exposure, and the like. However, in such methods, it is necessary to use a photoresist, effect development with a liquid developer after exposure and (depending on the method) carrying out etching. Therefore, a problem arises, e.g., in that the waste liquid must be properly treated before discarding. In a case in which a functional substance is used as the photoresist, another problem arises in that the product deteriorates due to the alkali solution used in the development process.

Formation of a highly elaborate pattern such as a color filter by printing has also been attempted. However, a pattern formed by printing tends to cause a problem in the precision of positioning, whereby highly precise pattern formation is difficult by this method.

On the other hand, in order to solve such problems as described above, the inventors of the present invention and other researchers have studied a method of producing a pattern-formed structure in which method a pattern is formed by using a substance whose wetting property is modified by the action of a photocatalyst. However, in such a conventional method of producing a pattern-formed structure by the action of a photocatalyst, the produced pattern-formed structure itself structurally includes the photocatalyst therein, whereby, depending the type of the pattern-formed structure, a problem arises in that the product may deteriorate due to the photocatalyst contained therein.

SUMMARY OF THE INVENTION

The present invention is provided in order to solve the above-described problems. The main object of the present invention is to provide a method of producing a pattern-formed structure, in which method a highly precise pattern formation is possible in production of a pattern-formed structure, no post-exposure treatment is required and no photocatalyst is contained inside the produced pattern-formed structure, whereby there is no concern that the obtained pattern-formed structure deteriorates.

In order to achieve the above-described object, a method of producing a pattern-formed structure, comprises the processes of: preparing a substrate for a pattern-formed structure having a characteristic-modifiable layer whose characteristic at a surface thereof can be modified by the action of photocatalyst; arranging the substrate for a pattern-formed structure and a photocatalyst-containing-layer side substrate having a photocatalyst-containing layer formed on a base material, the photocatalyst-containing layer containing photocatalyst, such that the characteristic-modifiable layer faces the photocatalyst-containing layer with a gap of no larger than 200 μm therebetween; and irradiating energy to the characteristic-modifiable layer from a predetermined direction, and modifying characteristic of a surface of the characteristic-modifiable layer, thereby forming a pattern at the characteristic-modifiable layer.

According to the present invention, a pattern having various properties can be formed in a highly precise manner, without necessity of any specific treatment after irradiation of energy. Further, as the photocatalyst-containing-layer side substrate is removed form the pattern-formed structure after irradiation of energy, the pattern-formed structure itself includes no photocatalyst-containing layer, whereby there is no possibility that the pattern-formed structure deteriorates as time elapses by the action of the photocatalyst. Yet further, in the present invention, as the gap or space between the photocatalyst-containing layer and the characteristic-modifiable layer is set within the above-described range, a pattern-formed structure having a pattern produced as a result of modification of characteristic thereof can be obtained in an efficient and highly precise manner.

In the present invention, the photocatalyst-containing layer and the characteristic-modifiable layer are preferably disposed such that the gap therebetween is in a range of 0.2 to 10 μm. As the gap between the photocatalyst-containing layer and the characteristic-modifiable layer is set in a range of 0.2 to 10 μm, a pattern-formed structure having a pattern produced as a result of modification of characteristic thereof can be obtained by irradiation of energy in a relatively short time.

In the present, the photocatalyst-containing-layer side substrate is preferably constituted of the base material and a photocatalyst-containing layer formed, in a pattern-like configuration, on the base materials. By forming the photocatalyst-containing layer in a pattern-like configuration as described above, a pattern having a different characteristic can be formed on the characteristic-modifiable layer, without using a photomask. Further, as only the characteristic of the portion, of the characteristic-modifiable layer surface, corresponding to the photocatalytic-containing layer is modified, the type of energy to be irradiated is not particularly restricted to energy provided in parallel and the direction of irradiating energy is not particularly restricted, either. Accordingly, in this aspect, the degree of freedom in the types of the energy source and the arrangement thereof is significantly increased, which advantageous.

In the present, it is preferable that the photocatalyst-containing-layer side substrate is constituted of the base material, the photocatalyst-containing layer formed on the base material, and a light-shielding portion formed in a pattern-like configuration, and the irradiation of energy at the aforementioned pattern forming process is carried out from the photocatalyst-containing-layer side substrate.

Providing the light-shielding portion in the photocatalyst-containing-layer side substrate as described above renders use or a photomask or the like during energy irradiation obsolete. Accordingly, the process of aligning the photocatalyst-containing-layer side substrate with a photomask, or the like, is no longer required, contributing to simplifying the whole production processes.

In the present, in the photocatalyst-containing-layer side substrate, the light-shielding portion is formed, in a pattern-configuration, on the base material and the photocatalyst-containing layer is formed on the light-shielding portion.

Alternatively, in the present, in the photocatalyst-containing-layer side substrate, the photocatalyst-containing layer is formed on the base material and the light-shielding portion is formed, in a pattern-configuration, on the photocatalyst-containing layer.

It is preferable that the light-shielding portion is disposed at a position close to the characteristic-modifiable layer, in terms of enhancing precision of the resulting characteristic pattern. Therefore, it is preferable that the light-shielding portion is disposed at the above-described position. Further, in a case in which the light-shielding portion is provided on the photocatalyst-containing layer, the light-shielding portion can serve as a spacer when the photocatalyst-containing layer is disposed with respect to the characteristic-modifiable layer in the aforementioned pattern forming process, which is advantageous.

In the present, in the photocatalyst-containing-layer side substrate, a spacer having thickness in a range of 0.2 to 10 $\mu$m is formed, in a pattern-like configuration, on the photocatalyst-containing layer and exposure is effected in a state in which the spacer is in contact with the characteristic-modifiable layer.

In the present, a spacer is provided in a pattern-like configuration on the photocatalyst-containing layer and exposure is effected in a state in which the spacer is in contact with the characteristic-modifiable layer. As a result, the distance between the photocatalyst-containing layer and the characteristic-modifiable layer can be easily kept in a range of 0.2 to 10 $\mu$m. Further, as the portions of the photocatalyst-containing layer on which the spacer has been formed is covered by the spacer, these portions do not cause any modification to the corresponding portions of the characteristic-modifiable layer upon irradiation of energy. Accordingly, the same pattern as that of the spacer can be formed on the characteristic-modifiable layer as a result of the characteristic modification thereof.

In the present, the spacer is preferably a light-shielding portion made of a light-shielding material. As the spacer serves as a light-shielding portion, a highly precise pattern can be formed by effecting irradiation of energy in a state in which the light-shielding portion is in close contact with the characteristic-modifiable layer.

The present invention also provides a method of producing a pattern-formed structure, comprising the processes of: preparing a photocatalyst-containing-layer side substrate in which a photocatalyst-containing layer is formed on a photomask by way of a primer layer, the photomask being formed by providing a light-shielding portion, in a pattern-like configuration, on a transparent base material; preparing a substrate for a pattern-formed structure having a characteristic-modifiable layer whose characteristic can be modified by the action of photocatalyst contained at least in the photocatalyst-containing layer; arranging the photocatalyst-containing-layer side substrate and the substrate for a pattern-formed structure: such that the photocatalyst-containing layer and the substrate for a pattern-formed structure are in contact with each other; or such that the characteristic-modifiable layer faces the photocatalyst-containing layer with a gap therebetween, the gap being narrow enough to allow the action of the photocatalyst of the photocatalyst-containing layer to effect on the characteristic-modifiable layer; effecting irradiation of energy to the substrates, thereby modifying characteristic of the irradiated portion of the characteristic-modifiable layer; and removing the photocatalyst-containing-layer side substrate, thereby obtaining a pattern-formed structure.

According to the present, a pattern can be produced with high sensitivity and in a highly precise manner, without necessity of carrying out any specific treatment after irradiation of energy. Further, as the photocatalyst-containing-layer side substrate is removed from the pattern after the irradiation of energy, the characteristic-modifiable-layer side substrate itself does not include any photocatalyst-containing layer. Therefore, there arises no concern that the characteristic-modifiable-layer side substrate deteriorates as time elapses by the action of the photocatalyst. Further, the residuals or the like generated at the light-shielding portion at the time of patterning and existing thereafter at the light-shielding portion or the opening portion between one light-shielding portion and the other do not affect the action of the photocatalyst, as a result of the excellent effect of the primer layer. Accordingly, the sensitivity of the photocatalyst can be enhanced and a pattern, produced as a result of modification of characteristic, can be obtained even by irradiation of energy in a relatively short time.

In the present invention, it is preferable that the gap which is narrow enough to allow the action of the photocatalyst of the photocatalyst-containing layer to effect on the characteristic-modifiable layer is in a range of 0.2 to 10 $\mu$m. As the gap between the photocatalyst-containing layer and the characteristic-modifiable layer is in a range of 0.2 to 10 $\mu$m, a pattern-formed body having a pattern produced as a result of modification of characteristic thereof can be obtained by irradiation of energy in a relatively short time.

In the present, it is preferable that the photocatalyst-containing layer is a layer made of photocatalyst. When the photocatalyst-containing layer is made of only photocatalyst, the efficiency at which the characteristic of the characteristic-modifiable layer is modified can be enhanced, whereby a pattern-formed structure can be efficiently produced.

In the present, it is preferable that the photocatalyst-containing layer is a layer formed by providing a photocatalyst in a form of a film on a base material by a vacuum film making method. By forming the photocatalyst-containing layer according to the vacuum film making method, a photocatalyst-containing layer having constant film thickness and less irregularities at the surface thereof can be produced, whereby formation of the characteristic pattern at the characteristic-modifiable layer surface can be performed evenly and in a highly efficient manner.

In the present, it is acceptable that the photocatalyst-containing layer is a layer containing a photocatalyst and a binder. By using a binder in such a manner, the photocatalyst-containing layer can be formed relatively easily, whereby a pattern-formed structure can be produced at a low cost.

In the present, it is preferable that the photocatalyst is at least one type of compound selected from the group consisting of titanium oxide ($TiO_2$), zinc oxide (ZnO), tin oxide ($SnO_2$), strontium titanate ($SrTiO_3$), tungsten oxide ($WO_3$), bismuth oxide ($Bi_2O_3$) and iron oxide ($Fe_2O_3$).

In the present, it is preferable that the photocatalyst is titanium oxide ($TiO_2$). Titanium dioxide, having high band gap energy, acts effectively as a photocatalyst, is chemically stable, has no toxicity, and is easily available.

In the present invention, it is preferable that the substrate for a pattern-formed structure is constituted, at least, of a substrate and the characteristic-modifiable layer provided on said substrate. As a characteristic-modifiable layer generally has various characteristics, it is preferable that the characteristic-modifiable layer is formed as a thin film on the substrate, in terms of strength, cost efficiency and functional aspects.

In the present invention, it is preferable that the characteristic-modifiable layer is a wetting-property-modifiable layer whose wetting property can be modified, such that a contact angle formed by a liquid on said wetting-property-modifiable layer is decreased upon irradiation of energy by the action of the photocatalyst in the photocatalyst-containing layer. Examples of the characteristic of the characteristic-modifiable layer include various characteristics, and one important example thereof is the change in the wetting property. By designing the characteristic-modifiable layer as a wetting-property-modifiable layer, a pattern-formed structure having a pattern produced as a result of modification of the wetting-property thereof by the action of the photocatalyst can be obtained. Accordingly, by attaching a composition for the functional portion such as ink to the site where the wetting property has been modified, various types of functional elements, including a color filter and a microlens, can be formed as described below.

In the present invention, it is preferable that the contact angle formed on said wetting-property-modifiable layer by a liquid whose surface tension is 40 mN/m is no smaller than 10° at an unexposed portion of the layer and no larger than 9° at an exposed portion. The portion which is not subjected to energy irradiation is a portion which is required to exhibit liquid-repellency and the portion which is subjected to energy irradiation is a portion which is required to exhibit lyophilicity. Therefore, the wetting property as described above is necessary in the wetting-property-modifiable layer.

In the present invention, it is preferable that said wetting-property-modifiable layer is a layer containing organopolysiloxane.

In the present invention, it is preferable that the organopolysiloxane is a polysiloxane containing the fluoroalkyl group. Such a wetting-property-modifiable layer can exhibit a large magnitude of change in the wetting property when energy is irradiated in a state in which the photocatalyst-containing layer is in contact therewith.

In the present invention, it is preferable that the organopolysiloxane is an organopolysiloxane obtained as a result of hydrolysis condensation or cohydrolysis condensation of at least one type of silicon compound generally represented by a formula $Y_nSiX_{(4-n)}$, wherein Y represents a group selected from the group consisting of the alkyl group, the fluoroalkyl group, the vinyl group, the amino group, the phenyl group and the epoxy group, X represents the alkoxyl group or the halogen group, and n represents an integer of 0 to 3. As a result of formation of the wetting-property-modifiable layer by using the above-mentioned organopolysiloxane as the material, a pattern-formed structure, in which a wetting-property pattern having a significantly different wetting characteristics from other portions has been formed, can be produced.

In the present invention, it is acceptable that the substrate for a pattern-formed structure is a self-supporting film, and at least one surface thereof is a film-like wetting-property-modifiable layer whose wetting property can be modified, such that a contact angle formed by a liquid on said wetting-property-modifiable layer is decreased upon irradiation of energy, by the action of the photocatalyst in the photocatalyst-containing layer. In such a pattern-formed structure, a pattern having different wetting characteristic can be obtained simply by effecting energy irradiation in a state in which one surface of a commercially available film, made of a predetermined material, is in contact with the photocatalyst-containing layer, which is advantageous in terms of cost reduction.

In the present invention, it is acceptable that the characteristic-modifiable layer is a decomposable and removable layer which is decomposed and removed by the action of the photocatalyst contained in the photocatalyst-containing layer. As a result of forming the characteristic-modifiable layer as a decomposable and removable layer which is decomposed and removed by the action of the photocatalyst contained in the photocatalyst-containing layer, the energy-irradiated portion thereof is decomposed and removed by the action of the photocatalyst, That is, the energy-irradiated portion can be completely decomposed and removed without necessity of any specific post-treatment. Therefore, for example, by designing the decomposable and removable layer as a photoresist and effecting exposure in a state in which the decomposable and removable layer is in contact with the photocatalyst-containing-layer side substrate, a pattern can be formed at the photoresist without necessity of carrying out the conventional development process. Other applications of various types are also possible in the structure of the present aspect.

In the present invention, it is preferable that a contact angle formed by a liquid on the decomposable and removable layer is different from a contact angle formed by the liquid on the substrate which has been exposed as a result of decomposition and removal of the decomposable and removable layer.

As a contact angle formed by a liquid on the decomposable and removable layer is different from a contact angle formed by the liquid on the substrate which has been exposed as a result of decomposition and removal of the decomposable and removable layer, as described above, at the energy-irradiated portion, the base material is exposed at the surface as a result of decomposition and removal of the decomposable and removable layer by the action of the photocatalyst. On the other hand, the decomposable and removable layer remains at the portion which is not been subjected to energy irradiation. Here, in a case in which a contact angle formed by a liquid on the decomposable and removable layer is different from a contact angle formed by the liquid on the exposed base material, if the decomposable and removable layer is made of a material having liquid repellency and the base material is made of a material having excellent affinity with a liquid (lyophilicity), for example, a portion of the decomposable and removable layer, at which portion a functional portion is to be formed, can be removed by irradiating energy in advance to the portion and thereby causing the photocatalyst to effect thereon. The energy-irradiated portion becomes a recessed portion which serves as an area having excellent lyophilicity, while the portion which is not subjected to energy irradiation becomes a projected portion which serves as a liquid-repellent area. Accordingly, the composition for the functional portion can be attached, easily and precisely, to the recessed portion in which the functional portion is to be provided and which serves as the area having excellent lyophilicity. Thus, in this case, the functional portion can be formed more precisely than the aforementioned case in which the characteristic-modifiable layer is a wetting-property-modifiable layer and there is no necessity of carrying out the post-treatment such as the developing or washing process after irradiation of energy. Therefore, the production process as a whole can be easily rendered a simpler state, whereby a functional element which is cheap and has a highly precise functional portion can be obtained.

In the present invention, it is preferable that the decomposable and removable layer is selected from the group consisting of a Self-Assembled Monolayer Film, a Langmuir-Blodgett's Film and a Layer-by-Layer Self-Assembled Film. These materials are decomposed and removed by the action of the photocatalys contained in the photocatalyst-containing layer, so as to effect various functions.

In the present invention, it is acceptable that the irradiation of energy is carried out when the photocatalyst-containing layer is being heated. By heating the photocatalyst, the sensitivity of the photocatalys is enhanced, whereby modification of the characteristic at the characteristic-modifiable layer can be efficiently carried out.

The present invention discloses a photomask, comprising: a transparent base material; a light-shielding portion formed, in a pattern-like configuration, on the transparent base material; a primer layer formed on the transparent base material and the light-shielding portion; and a photocatalyst-containing layer formed on the primer layer. When such a photomask as described above is used, by simply irradiating energy by way of the photomask, patterns can be obtained as a result of modification of various characteristics, whereby a pattern-formed structure can be obtained efficiently.

Further, the present invention discloses a photomask, comprising: a transparent base material; a photocatalyst-containing layer formed on the transparent base material; and a light-shielding portion formed, in a pattern-like configuration, on the photocatalyst-containing layer, such that the shielding portion has thickness of 0.2 to 10 μm.

The present invention also discloses a photomask, comprising: a transparent base material; a light-shielding portion formed, in a pattern-like configuration, on the transparent base material, such that the shielding portion has thickness of 0.2 to 10 μm; and a photocatalyst-containing layer formed on the transparent base material and the light-shielding portion. In the aforementioned photomasks, by simply irradiating energy by way of the photomask onto the substrate for a pattern-formed structure having the aforementioned characteristic-modifiable layer, patterns are obtained as a result of modification of various characteristics, whereby a pattern-formed structure can be obtained efficiently.

The present invention discloses a functional element, comprising: a pattern-formed structure produced by the method of producing a pattern-formed structure according to the aforementioned method of producing a pattern-formed structure; and a functional portion provided at said pattern-formed structure. By using a pattern-formed structure of the present invention, a functional element can be easily obtained.

Examples of the functional element described in the aforementioned functional element, include a functional element made of metal. In this case, the functional element can be applied to a highly precise electric circuit board and the like.

The present invention discloses a color filter, in which the functional portion of the aforementioned functional element, is a pixel portion. Such a color filter includes highly minute pixel portions formed in a highly precise manner, and thus has an extremely high quality.

According to the present invention, patterns having various characteristics can be formed in a highly precise manner, without necessity to carry out any specific post-treatment after energy irradiation. Further, as the photocatalyst-containing-layer side substrate is removed from the pattern-formed structure after energy irradiation, the pattern-formed structure itself is free of the photocatalyst-containing layer. Accordingly, there is no concern that the pattern-formed structure deteriorates as time elapses due to the action of the photocatalyst. Yet further, as the gap between the photocatalyst-containing layer and the characteristic-modifiable layer is set within the above-mentioned range, there is achieved an excellent effect that a pattern-formed structure, having a pattern produced as a result of efficient and excellently precise modification of characteristic thereof, can be obtained.

DESCRIPTION OF THE PREFERRED EMBODIMENTS

Figure 1A:
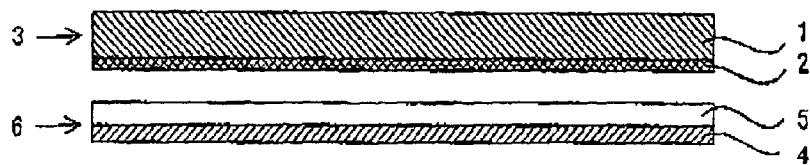
FIG. 1 is a process drawing which shows one example of a method of producing a pattern-formed structure of the present invention.

A method of producing a pattern-formed structure of the present invention will be first described and then a photomask which can be used in this method of producing a pattern-formed structure will be described.

A Method of Producing a Pattern-Formed Structure

The method of producing a pattern-formed structure of the present invention, comprises the processes of:
  preparing a substrate for a pattern-formed structure having a characteristic-modifiable layer whose characteristic at a surface thereof can be modified by the action of photocatalyst;
  preparing a photocatalyst-containing-layer side substrate having a photocatalyst-containing layer formed on a base material, the photocatalyst-containing layer containing photocatalyst;
  arranging the substrate for a pattern-formed structure and the photocatalyst-containing-layer side substrate such that the characteristic-modifiable layer faces the photocatalyst-containing layer with a gap of no larger than 200 μm therebetween; and
  irradiating energy to the characteristic-modifiable layer by way of the photocatalyst-containing layer from a predetermined direction, and modifying characteristic of a surface of the characteristic-modifiable layer, thereby forming a pattern at the characteristic-modifiable layer.

In short, in the method of producing a pattern-formed structure of the present invention, a pattern-formed structure is produced by: disposing the photocatalyst-containing layer and the characteristic-modifiable layer with a predetermined distance or gap therebetween; irradiating energy from a predetermined direction, so that the characteristic of a portion of the characteristic-modifiable layer, which portion faces the photocatalyst-containing layer and has been exposed, is modified by the action of the photocatalyst in the photocatalyst-containing layer and a pattern is formed at the portion of the characteristic-modifiable layer as a result of the modification of the characteristic of the layer. Accordingly, as post-treatments (such as development and washing) after exposure are no longer required in the pattern forming process, a pattern having different characteristic can be formed by a production process which includes less number of processes the conventional method, i.e., in a cost-efficient manner. By adequately selecting the type of the material of the characteristic-modifiable layer, pattern-formed structures for various applications can be produced.

Further, in the present invention, the characteristic of the characteristic-modifiable layer is first modified by the action of the photocatalyst contained in the photocatalyst-containing layer and then the pattern-formed-structure side substrate is rendered to a pattern-formed structure by removing the photocatalyst-containing-layer side substrate. As a result, the resulting pattern-formed structure does not contain the photocatalyst therein. Therefore, any inconvenience such as deterioration of the obtained pattern-formed structure as time elapses by the action of the photocatalyst can be reliably prevented.

The method of producing a pattern-formed structure of the present invention as mentioned above will be described in detail hereinafter with reference to the accompanying drawings. FIG. 1 shows one example of the method of producing a pattern-formed structure of the present invention.

In this example, first, a photocatalyst-containing-layer side substrate 3 formed by providing a photocatalyst-containing-layer 2 on a base material 1, and a substrate for a pattern-formed structure formed by providing a characteristic-modifiable layer 5 on a substrate 4, are each prepared (refer to FIG. 1A, process of preparing a substrate for a pattern-formed structure).

Figure 1B:
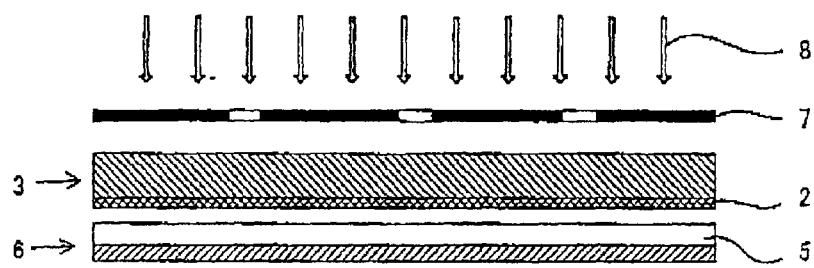
Figure 1C:
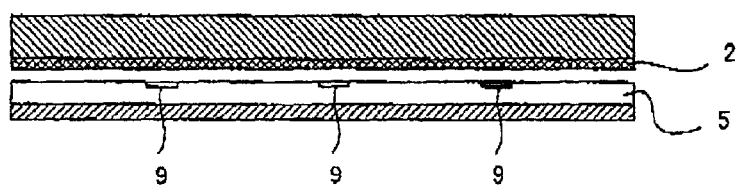

Next, as shown in FIG. 1B, the photocatalyst-containing-layer side substrate 3 and the substrate for a pattern-formed structure 6 are disposed such that the photocatalyst-containing layer 2 faces the characteristic-modifiable layer 5 with a gap or space of a predetermined length therebetween. Thereafter, ultraviolet 8 is irradiated from the photocatalyst-containing-layer side substrate 3 side by way of a photomask 7 on which a required pattern has been drawn. As a result, as shown in FIG. 1C, a pattern constituted of an area 9 whose characteristic has been modified is formed at the surface of the characteristic-modifiable layer 5 (the pattern-forming process).

The above-described irradiation of UV is carried out by way of the photomask 7. However, as described hereinafter, a photocatalyst-containing layer formed in a pattern-like configuration or a photocatalyst-containing-layer side substrate including a light-shielding portion formed therein may also be used. In these additional examples, exposure is effected on the whole surface of the substrate for a pattern-formed structure, without using the photomask 7.

Next, the process of removing the photocatalyst-containing-layer side substrate from the upper portion of the substrate for a pattern-formed structure 6 is carried out (FIG. 1D), whereby a pattern-formed structure 6 having a pattern 9 produced as a result of modification of the surface characteristic can be obtained.

The method of producing a pattern-formed structure of the present invention as mentioned above will be described in detail for each element.

1. Preparation of a Photocatalyst-Containing-Layer Side Substrate

In the present invention, a photocatalyst-containing-layer side substrate used in the below-described pattern forming process is first prepared. The photocatalyst-containing-layer side substrate includes a base material and a photocatalyst-containing layer containing a photocatalyst formed on the base material.

The photocatalyst-containing-layer side substrate includes at least a photocatalyst-containing layer and the base material. In general, a film-like photocatalyst-containing layer is formed on a base material by a predetermined method. A photocatalyst-containing-layer side substrate including a light-shielding portion formed in a pattern-like configuration can also be used.

(The Photocatalyst-Containing Layer)

The structure of the photocatalyst-containing layer used in the present invention is not particularly restricted as long as the photocatalyst contained in the photocatalyst-containing layer is capable of modifying the characteristic of the characteristic-modifiable layer. The photocatalyst-containing layer may be constituted of a photocatalyst and a binder or constituted of only a photocatalyst of film-like form. The wetting property of the photocatalyst-containing layer surface may be either lyophilic or liquid-repellent.

Figure 2:
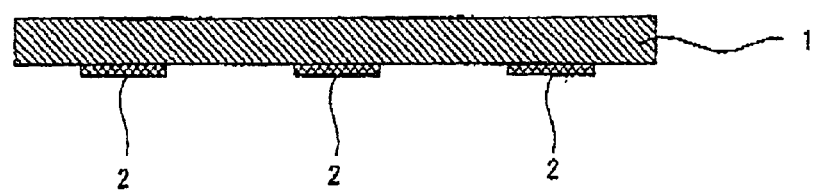
FIG. 2 is a schematic sectional view which shows one example of a photocatalyst-containing-layer side substrate used in the present invention.

The photocatalyst-containing layer used in the present invention may be provided on the whole surface of the base material 1, for example, as shown in FIG. 1A. Alternatively, the photocatalyst-containing layer 2 may be formed, in a pattern-like configuration, on the base material 1, as shown in FIG. 2.

By forming the photocatalyst-containing layer in a pattern-like configuration, the pattern irradiation process using a photomask or the like is no longer required upon energy irradiation in a state in which the photocatalyst-containing layer and the characteristic-modifiable layer are disposed with a gap or space of a predetermined length therebetween, as described below, in the pattern forming process. In this case, a pattern generated as a result of modification of the characteristic at the characteristic-modifiable layer can be formed by simple energy irradiation on the whole surface of the photocatalyst-containing layer.

The method of patterning the photocatalyst-containing layer is not particularly restricted, and the photolithography method, for example, may be employed.

As only the characteristic of the portion of the characteristic-modifiable layer, which portion actually faces the photocatalyst-containing layer, needs to be modified, energy irradiation may be effected from any direction, as long as energy is irradiated at the portion where the photocatalyst-containing layer faces the characteristic-modifiable layer. Further, the type of irradiated energy is not limited to energy which is applied in a form of parallel light (and the like), which is advantageous.

The mechanism of how the photocatalyst, typically represented by titanium dioxide described below, acts in the aforementioned photocatalyst-containing layer is not clearly known. It is assumed, however, that carriers generated by irradiation of light induce the chemical structure of the organic substances to change, by way of a direct reaction of the carriers with the nearby compound or by the action of the active oxygen species generated under the presence of oxygen and water. In the present invention, it is assumed that the carries affect the compounds in the characteristic-modifiable layer disposed in the vicinity of the photocatalyst-containing layer.

Examples of the photocatalyst used in the present invention include titanium dioxide ($TiO_2$), zinc oxide (ZO), tin oxide ($SnO_2$), strontium titanate ($SrTiO_3$), tungsten oxide ($WO_3$), bismuth oxide ($Bi_2O_3$) and iron oxide ($Fe_2O_3$) known as photo-semiconductors. One type, or more than one type in combination, of these compounds may be selected for use.

In the present invention, titanium dioxide is especially preferable for use because titanium dioxide has high band gap energy, is chemically stable, has no toxicity, and is easily available. The two types of titanium dioxide, i.e., anatase-type titanium dioxide and rutile type titanium dioxide, can be each applicable to the present invention. Anatase-type titanium dioxide is more preferable. The excitation wavelength of anatase-type titanium dioxide is 380 nm or less.

Examples of anatase-type titanium dioxide as described above include anatase-type titania sol of hydrochloric acid peptisation type ("STS-02", the average particle diameter is 7 nm, manufactured by Ishihara Sangyo and "ST-K01", manufactured by Ishihara Sangyo), anatase-type titania sol of nitrate acid peptisation type ("TA-15", the average particle diameter is 12 nm, manufactured by Nissan Chemical Industries, Ltd.), and the like.

The smaller the particle diameter of the photocatalyst is, the more effectively the photocatalyst reaction occurs, which is preferable. Therefore, the average particle diameter of the photocatalyst to be used is preferably no larger than 50 nm and more preferably no larger than 20 nm.

The photocatalyst-containing layer of the present invention may be constituted of only the photocatalyst, as described above. However, the photocatalyst-containing layer may be formed as a mixture of the photocatalys and a binder.

When the photocatalyst is constituted of only the photocatalyst, the efficiency in modification of the characteristic of the characteristic-modifiable layer is improved, which is advantageous in terms of cost reduction because the time required for the treatment can be shortened, for example. On the other hand, when the photocatalyst-containing layer is constituted of the photocatalyst and the binder, the structure has an advantage that the photocatalyst-containing layer can be formed easily.

Examples of the method of forming a photocatalyst-containing layer constituted of only the photocatalyst include the spattering method, the CVD method, and a method using a vacuum-film-producing method such as the vacuum deposition method. By forming a photocatalyst-containing layer by the vacuum-film-producing method, a photocatalyst-containing layer which is in a form of a uniform film and includes only the photocatalyst can be produced, whereby the characteristic of the characteristic-modifiable layer can be modified evenly. Further, in this case, as the photocatalyst-containing layer is constituted of only the photocatalyst, the characteristic of the characteristic-modifiable layer can be modified efficiently as compared with the case in which the photocatalyst-containing layer includes a binder.

Examples of the method of forming a photocatalyst-containing layer constituted of only the photocatalyst include the method of forming amorphous titania on a base material and causing the amorphous titania to phase-change to the crystalline titania by sintering (in the case in which titanium dioxide is used as the photocatalyst). The amorphous titania used in the aforementioned method can be obtained, for example, by hydrolysis, dehydrating condensation of inorganic salts of titanium such as titanium tetrachloride, titanium sulfate, or hydrolysis, dehydrating condensation of organic titanium compounds such as tetraethoxytitanium, tetraisopropoxytitatnium, tetra-n-propoxytitanium, tetrabutoxytitanium, tetramethoxytitanium, in the presence of an acid. Next, the obtained amorphous titania is denatured to atanase-type titania by sintering at 400 to 500° C. or rutile-type titania by sintering at 600 to 700° C.

In the case in which a binder is used, a binder having a main skeleton whose bonding energy is high enough to prevent itself from being decomposed due to the above-described photo-excitation of the photocatalyst is preferable. As a preferable example of such a binder, organopolysiloxane can be raised. When organopolysiloxane is used as a binder, the above-described photocatalyst-containing layer can be formed by: preparing a coating solution by dispersing the photocatalyst and organopolysiloxane as the binder in a solvent, optionally with other additives; and coating the coating solution on a base material. As the solvent to be used, an alcohol-based organic solvent such as ethanol, isopropanol is preferable. The coating process may be carried out by any of known coating methods such as spin coating, spray coating, dip coating, roll coating and bead coating. In a case in which a UV hardening type component is contained as the binder, the photocatalyst-containing layer can be formed by carrying out the hardening process by irradiating ultraviolet.

As the binder, an amorphous silica precursor can also be used. This amorphous silica precursor is preferably a silicon compound represented by the general formula $SiX_4$ (wherein X is a halogen, the methoxy group, the ethoxy group or the acetyl group) or silanol as a hydrolysate thereof, or polysiloxane whose molecular weight is no larger than 3000.

Specific examples of such a binder include tetraethoxysilane, tetraisopropoxysilane, tetra-n-propoxysilane, tetrabutoxysilane, tetramethoxysilane and the like. In this case, a photocatalyst-containing layer can be formed by: evenly dispersing the amorphous silica precursor and the particles of the photocatalyst in non-aqueous solvent; effecting hydrolysis of the components by the moisture in the air, thereby forming silanol on the base material; and effecting dehydrating condensation of silanol at the room temperature. When the dehydrating condensation polymerization of silanol is carried out at a temperature of 100° C. or higher, the degree of polymerization of silanol increases and the strength of the film surface can be enhanced. The binder of the aforementioned respective types may be used solely or as a combination of two or more types.

When a binder is used, the content of the photocatalyst in the photocatalyst-containing layer may be set in a range of 5 to 60 weight %, and preferably in a range of 20 to 40 weight %. The thickness of the photocatalyst-containing layer is preferably in a range of 0.05 to 10 $\mu$m.

The photocatalyst-containing layer may also contain a surfactant, in addition to the above-mentioned photocatalyst and the binder. Specific examples of the surfactant include: a hydrocarbon-based non-ionic surfactant such as NIKKOL BL, BC, BO, BB series manufactured by NIKKO CHEMICALS; a fluorine or silicone-based non-ion surfactant such as ZONYL FSN, FSO manufactured by DuPont Co., Ltd., Surflon S-141, 145 manufactured by Asahi Glass, Megafac-141, 144 manufactured by Dainippon Ink & Chemicals, Futargent F-200, F251 manufactured by Neos Co., Ltd., Unidyne DS-401, 402 manufactured by Daikin Industries, and Frorard FC-170, 176 manufactured by 3M Co., Ltd; a cationic surfactant; an anionic surfactant; and an ampholytic surfactant.

The photocatalyst-containing layer may further include, in addition to the above-mentioned surfactants, oligomer or polymer of polyvinyl alcohol, unsaturated polyester, acrylic resin, polyethylene, diarylphthalate, ethylenepropylenediene monomer, epoxy resin, phenol resin, polyurethane, melamine resin, polycarbonate, polyvinyl chloride, polyamide, polyimide, styrenebutadiene rubber, chloroprene rubber, polypropylene, polybutylene, polystyrene, polyvinyl acetate, polyester, polybutadiene, polybenzimidazol, polyacrylonitril, epichlorohydrine, polysulfide, and polyisoprene.

(Base Material)

In the present invention, as shown in FIG. 1, the photocatalyst-containing-layer side substrate 3 includes at least the base material 1 and the photocatalyst-containing layer 2 formed on the base material 1.

In the present invention, the material constituting the base material in use is appropriately selected, in consideration of the direction in which energy is irradiated in the pattern forming process described below, whether or not the obtained pattern-formed structure needs to be transparent and the like.

Specifically, in a case in which the pattern-formed structure employs an opaque material as a substrate, for example, the energy irradiation must (i.e., inevitably) be carried out from the side of the photocatalyst-containing-layer side substrate. That is, energy is irradiated in a state in which the photomask 7 is disposed on the side of the photocatalyst-containing-layer side substrate 3, as shown in FIG. 1B. Further, in a case in which a light-shielding pattern is formed in advance, in a predetermined pattern, in/on the photocatalyst-containing-layer side substrate and the characteristic-modifiable layer is patterned by using the light-shielding portion as described below, energy irradiation needs to be carried out from the side of the photocatalyst-containing-layer side substrate. In such a structure, the base material is required to be transparent.

On the other hand, in the case in which the pattern-formed structure is transparent, it is possible to irradiate energy in a state in which a photomask is disposed on the side of the substrate for a pattern-formed structure. In the case in which a light-shielding portion is formed inside the substrate for a pattern-formed structure as described above, energy must be irradiated from the side of the substrate for a pattern-formed structure. In this case, the base material does not need to be transparent.

The base material used in the present invention may be a flexible material such as a film made of a resin or an inflexible material such as a glass substrate. The type of the base material is appropriately selected in accordance with the energy irradiation method in the pattern forming process described below.

As described above, the material of the base material used in the photocatalyst-containing-layer side substrate of the present invention is not particularly restricted. However, as the photocatalyst-containing-layer side substrate is repeatedly used in the present invention, a material having a predetermined strength and exhibiting excellent adhesion property of the surface thereof to the photocatalyst-containing layer is preferably employed.

Specific examples of the base material include glass, ceramic, metal, plastics and the like;

A primer layer may be formed on the base material such that the adhesion between the base material surface and the photocatalyst-containing layer is enhanced. Examples of the primer layer include a silane-based or titanium-based coupling agent.

(Light-Shielding Portion)

A light-shielding portion formed in a pattern-like configuration may be formed in the photocatalyst-containing-layer side substrate used in the present invention. When such a photocatalyst-containing-layer side substrate having a light-shielding portion is used, either the use of a photomask or the drawing irradiation by laser beam is no longer required at the time of energy irradiation. Accordingly, alignment of the photocatalyst-containing-layer side substrate with the photomask is no longer required, whereby the production process can be made simpler and the expensive device needed for the drawing irradiation by laser beam can be rendered unnecessary, which is advantageous in terms of cost reduction.

The photocatalyst-containing-layer side substrate having the above-mentioned light-shielding portion can be realized by one of the two embodiments, depending on the position at which the light-shielding portion is formed.

Figure 3:
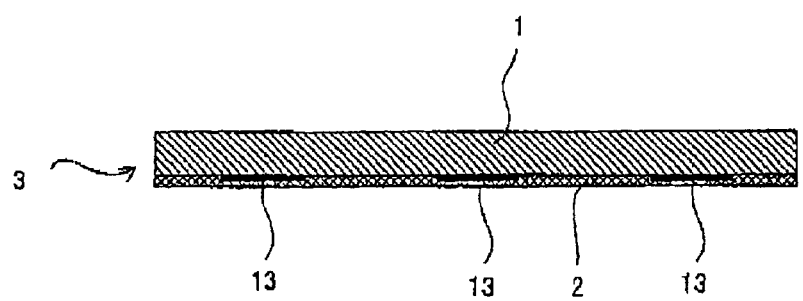
FIG. 3 is a schematic sectional view which shows another example of a photocatalyst-containing-layer side substrate used in the present invention.
Figure 4:
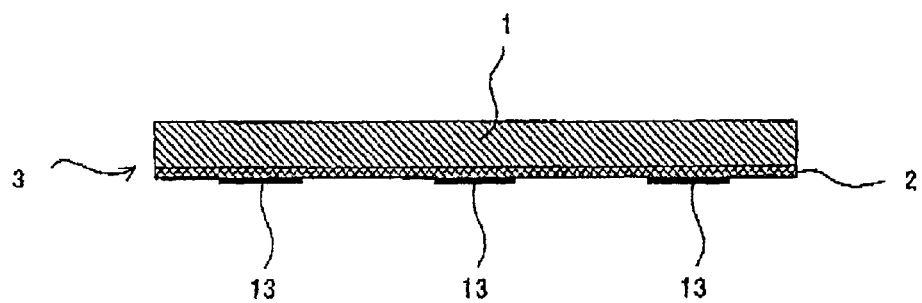
FIG. 4 is a schematic sectional view which shows yet another example of a photocatalyst-containing-layer side substrate used in the present invention.

In the first embodiment, as shown in FIG. 3, a photocatalyst-containing-layer side substrate 3 includes a base material 1, a light-shielding portion 13 formed on the base material 1, and a photocatalyst-containing layer 2 formed on the light-shielding portion 13. In the second embodiments, as shown in FIG. 4, a photocatalyst-containing-layer side substrate 3 includes a base material 1, a photocatalyst-containing layer 2 formed on the base material 1, and a light-shielding portion formed on the photocatalyst-containing layer 2.

In each of these two embodiments, as compared with the case in which a photomask is used, the light-shielding portion is disposed in the vicinity of the photocatalyst-containing layer and the characteristic-modifiable layer facing with a gap therebetween, whereby the influence of the scattering of energy inside the base material can be reduced. As a result, the pattern irradiation of energy can be performed in an extremely accurate manner.

In the embodiment in which the light-shielding portion is formed on the photocatalyst-containing layer, by setting the film thickness of the light-shielding portion at the same length as the predetermined distance to be maintained between the photocatalyst-containing layer and the characteristic-modifiable layer, the light-shielding portion can be used as a spacer for keeping the aforementioned distance between the two layers constant when the two layers are disposed so as to face each other.

In other words, when the photocatalyst-containing layer and the characteristic-modifiable layer are disposed such that these two layers face each other with a predetermined distance or gap therebetween, by disposing the light-shielding portion and the characteristic-modifiable layer so that these two layers closely contact with each other, the aforementioned gap of the predetermined length can be reliably obtained in an accurate manner. As a result, a pattern can be precisely formed on the characteristic-modifiable layer by effecting energy irradiation, in this aforementioned state, from the side of the photocatalyst-containing-layer side substrate.

The method of forming the light-shielding portion as described above is not particularly restricted, and any appropriate method may be selectively employed in accordance with the characteristic of the formation surface of the light-shielding portion or the blocking property thereof with respect to the necessitated energy.

Examples of the method of forming the light-shielding portion include the spattering-method and a method of forming a metal thin film such as chrome having the thickness of 1000 to 2000 Å by the vacuum deposition method or the like and patterning the obtained thin film. As the method of patterning, a conventionally known patterning method such as spattering can be employed.

Examples of the patterning method also include a method of forming, in a pattern-like configuration, a layer constituted of a resin binder and light-shielding particles, such as carbon fine particles, metal oxides, inorganic pigments, organic pigments, contained in the resin binder. Examples of the resin binder to be used include: polyimide resin, acrylic resin, epoxy resin, polyacryl amide, polyvinyl alcohol, gelatin, casein, cellulose (the respective types of these resins may be used singly or as a mixture of two or more types); a photosensitive resin; and a resin composition of the Q/W emulsion type (such as a resin composition obtained by making a reactive silicone in an emulsion state). The thickness of such a light-shielding portion made of resin may be set in a range of 0.5 to 10 $\mu$m. The method of patterning the light-shielding portion made of resin include the conventionally known methods such as the photolithography method and the printing method.

In the above-mentioned description, two cases i.e., the case in which the light-shielding portion is provided between the base material and the photocatalyst-containing layer and the case in which the light-shielding portion is provided an the photocatalyst-containing layer, have been explained regarding the position at which the light-shielding portion is formed. However, another embodiment, in which the light-shielding portion is provided on the surface of the base material at which the photocatalyst-containing layer has not been formed, can also be employed. In this third embodiment, for example, a photomask may be closely but removably attached to the surface. This structure can be preferably employed when the pattern-formed structure is modified in a small lot.

(Primer Layer)

In the present invention, in the case in which the photocatalyst-containing-layer side substrate includes a base material, a light-shielding portion formed in a pattern-like configuration on the base material, and the photocatalyst-containing layer formed on the light-shielding portion, it is preferable that a primer layer is provided between the light-shielding portion and the photocatalyst-containing layer.

The effect/function of the primer layer is not completely known. It is assumed that, by providing a primer layer between the light-shielding portion and the photocatalyst-containing layer, the primer layer serves to prevent diffusion of impurities from the light-shielding portion and the opening portion formed in the light-shielding portion (the impurities such as metal, metal ion, residuals generated at the time of patterning the light-shielding portion, in particular) which impurities could be a factor of inhibiting modification of the characteristic of the characteristic-modifiable layer by the photocatalyst. Accordingly, by providing a primer layer, the treatment for effecting modification of the characteristic proceeds in a highly sensitive manner, whereby a pattern can be obtained at a high resolution.

In the present invention, the primer layer serves to prevent, the impurities present in the light-shielding portion and the opening portion formed in the light-shielding portion, from affecting the effect of the photocatalyst. Therefore, the primer layer is preferably formed at the whole surface of the light-shielding portion, covering the opening portion thereof, as well.

Figure 5:
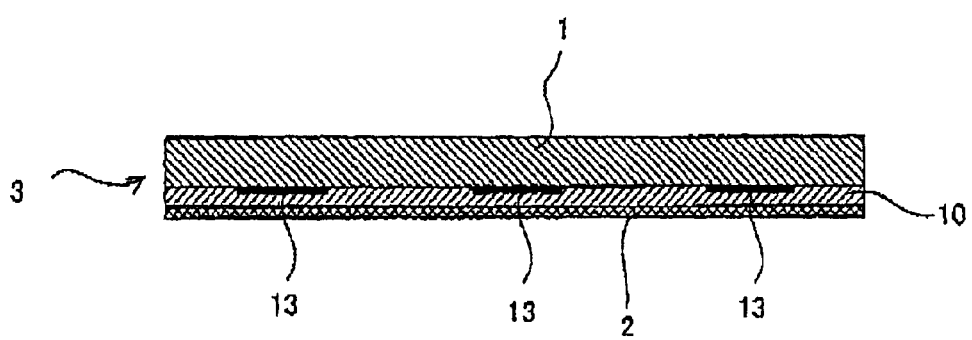
FIG. 5 is a schematic sectional view which shows yet another example of a photocatalyst-containing-layer side substrate used in the present invention.

FIG. 5 shows one example of the photocatalyst-containing-layer side substrate in which a primer layer as described above has been formed. The light-shielding portion 13 is formed at the surface of the base material 1, and a primer layer 10 is formed on the same surface of the base material 1 as the light-shielding portion 13 has been formed. The photocatalyst-containing layer 2 is formed at the surface of the primer layer 10.

The structure in which the light-shielding portion is formed, in a pattern-like configuration, on the base material is a standard photomask structure. Accordingly, the structure of FIG. 5 is a modification of the standard structure, in which the photocatalyst-containing layer is formed on the photomask by way of a primer layer.

The primer layer of the present invention is not particularly restricted as long as the primer layer has a structure which prevents the photocatalyst-containing layer from making a physically direct contact with the photomask. In other words, it suffices as long as the light-shielding portion of the photomask is prevented, by the primer layer, from making contact with the photocatalyst-containing layer.

The material constituting the primer layer is not particularly restricted. An inorganic material which is not easily decomposed by the action of the photocatalyst is preferable. A specific example thereof is amorphous silica. When such amorphous silica is used, it is preferable that the precursor of the amorphous silica is a silicon compound represented by the general formula $SiX_4$ (wherein X is a halogen, the methoxy group, the ethoxy group or the acetyl group) and the amorphous silica is silanol as a hydrolysate of the precursors or polysiloxane whose molecular weight is no larger than 3000.

The thickness of the primer is preferably in a range of 0.001 to 1 $\mu$m, and more preferably in a range of 0.001 to 0.1 $\mu$m.

2. Process of Preparing a Substrate for a Pattern-Formed Structure

In the method of preparing a pattern-formed structure of the present invention, the substrate for a pattern-formed structure 6, which is to be disposed at a position opposite to the aforementioned photocatalyst-containing-layer side substrate 3, is prepared, as shown in FIG. 1.

The type of the substrate for a pattern-formed structure is not particularly restricted as long as the substrate has at least a characteristic-modifiable layer. However, it is preferable that the characteristic-modifiable layer is formed on the substrate, in terms of the strength thereof. Other protective layers or the like may be formed, if necessary, but the characteristic-modifiable layer must be exposed at the whole surface (or at some portions of the surface) on at least one side of the substrate for a pattern-formed structure.

In the present invention, "a substrate for a pattern-formed structure" represents a substrate in a state in which a pattern, generated as a result of characteristic modification at certain sites, has not been formed at the characteristic-modifiable layer thereof. When the substrate for a pattern-formed structure is subjected to exposure and a pattern, generated as a result of characteristic modification at certain sites, has been formed at the characteristic-modifiable layer, the resulting structure is regarded as "a pattern-formed structure".

(1) Characteristic-Modifiable Layer

The characteristic-modifiable layer in the present invention may be prepared as any type of layer, as long as the property or characteristic of the layer is modified by the action of the photocatalyst. For example, the characteristic-modifiable layer may be prepared as a layer which is colored by the action of the photocatalyst, by mixing a photochromic material such as spiropyran or an organic colorant which is decomposed by the action of the photocatalyst in the characteristic-modifiable layer.

Alternatively, by using a polymer material such as polyolefin (polyethylene, polypropylene or the like), the characteristic-modifiable layer may be prepared as a layer in which the attaching property to various substances is enhanced at the exposed portions thereof due to the introduction of a polar group or the roughened state of the surface caused by the photocatalytic effect. By designing the characteristic-modifiable layer as an attaching-property-modifiable layer whose attaching property can be modified, a pattern exhibiting excellent attaching property can be formed by the pattern exposure. In such a pattern-formed structure having a pattern at which the attaching property is excellent, for example, a pattern of a metal thin film can be formed by: depositing a metal component on the pattern-formed structure as described above; forming a thin film of metal; and peeling the metal thin film by using an adhesive or a chemical, by utilizing difference in attaching property between the pattern portion and the non-patterned portion of the attaching-property-modifiable layer. According to this method, a pattern of a metal thin film can be formed without forming a pattern at a photoresist, whereby a print wiring board or an electric circuit element and the like, having a more minute and precise pattern than the pattern produced by the printing method, can be formed.

Further, in the present invention, the above-mentioned characteristic-modifiable layer may be formed by either a dry-type method such as the vacuum deposition method or a wet-type method such as spin coating or dip coating methods.

As described above, the type of the characteristic-modifiable layer is not particularly restricted as long as the layer has various characteristics which are modified by the action of the photocatalyst. However, in the present invention, two particular examples: a wetting-property-modifiable layer in which a wetting-property-based pattern is formed as a result of modification of the wetting property of the characteristic-modifiable layer by the action of the photocatalyst; and a decomposable and removable layer in which the characteristic-modifiable layer is decomposed and removed by the action of the photocatalyst, whereby a pattern is formed by the resulting projections and recesses, are especially preferable because these two examples clearly exhibit the advantageous effect of the present invention in the relationship with the resulting functional element or the like.

(Wetting-Property-Modifiable Layer)

The type of the wetting-property-modifiable layer in the present invention is not particularly restricted as long as the wetting property at the surface thereof is modifiable by the action of the aforementioned photocatalyst. In general, a layer whose wetting property (at the surface thereof) is modified such that a contact angle formed by a liquid on the surface thereof is decreased by the action of the photocatalyst in accordance with energy irradiation, is preferable.

That is, by preparing the characteristic-modifiable layer as the wetting-property-modifiable layer whose wetting property at the surface thereof is modified such that a contact angle formed by a liquid on the surface thereof is decreased by exposure (the term "exposure" represents not only irradiation of light but also irradiation of energy, in the present invention), the wetting property of the characteristic-modifiable layer surface can be easily modified in a pattern-like configuration by energy irradiation by way of the light-shielding portion, whereby a pattern constituted of lyophilic areas in which a contact angle formed by a liquid is relatively small can be formed. By attaching a composition for a functional portion to the lyophilic areas, a functional element can be easily formed In short, a functional element can be produced efficiently, which is advantageous in terms of cost reduction.

Here, "a lyophilic area" represents an area in which a contact angle formed by a liquid is relatively small. Specifically, in a case in which the functional element is a color filter, the lyophilic area is an area which exhibits excellent wetting property for ink for coloring pixel portions (colored layers) as the composition for the functional portion. In a case in which the functional element is a microlens, the lyophilic area is an area which exhibits excellent wetting property for the composition forming a microlens. In contrast, a liquid-repellent area represents an area in which a contact angle formed by a liquid is relatively large and thus the wetting property thereof for the above-mentioned composition for the functional portion is relatively poor.

Regarding the wetting-property-modifiable layer, in the unexposed i.e., water-repellent area thereof, a contact angle formed on the surface of the unexposed area by a liquid having surface tension of 40 mN/m is to be no smaller than 10°, and it is preferable that a contact angle formed on the same surface by a liquid having surface tension of 30 mN/m is no smaller than 10°, and it is more preferable that a contact angle formed on the same surface by a liquid having surface tension of 20 mN/m is no smaller than 10°. In the present invention, the unexposed portion is required to exhibit excellent liquid-repellency. If a contact angle formed by a liquid in the unexposed portion is too small, the liquid-repellency of the portion may not be sufficiently high, whereby there is a possibility that the composition for forming the functional portion remains at the portion, which is not desirable.

The wetting-property-modifiable layer decreases the magnitude of a contact angle formed by a liquid thereon after being subjected to exposure. A contact angle formed on the exposed surface of the wetting-property-modifiable layer by a liquid having surface tension of 40 mN/m, is to be no larger than 9°, and it is preferable that a contact angle formed on the same surface by a liquid having surface tension of 50 mN/m is no larger than 10°, and it is more preferable that a contact angle formed on the same surface by a liquid having surface tension of 60 mN/m is no larger than 10°. If a contact angle formed by a liquid on the surface of the exposed i.e., lyophilic area is too high, the composition for forming the functional portion may not spread properly at the area, whereby there may arise a problem of undesirably discontinuous distribution of the functional portion and the like.

Here, "a contact angle" is obtained as the result of measurement in which a contact angle, formed by a liquid having various surface tension, is measured (30 seconds after dropping drops of the liquid from a microsyringe) by using a contact angle analyzer ("CA-Z type" manufactured by Kyowa Kaimen Kagaku Co., Ltd.) or from the graph plotted based on the results. In the measurement, the wetting-index standard solution manufactured by Junsei Kagaku Co., Ltd. was used as the liquids having various surface tension.

When the above-mentioned wetting-property-modifiable layer is used in the present invention, the wetting-property-modifiable layer may be formed as a layer containing fluoride in which the fluoride content of the layer is decreased by energy irradiation thereto, due to the photocatalytic effect, as compared with the fluoride content before the energy irradiation.

In the wetting-property-modifiable layer having the above-mentioned characteristic, a pattern constituted of the portions at which the fluoride content is low can be formed easily, by pattern-irradiating energy to the wetting-property-modifiable layer. It should be noted that, as fluoride has extremely low surface energy, the surface of a substance whose fluoride content is relatively high exhibits a relatively low critical surface tension. Therefore, the critical surface tension at a portion whose fluoride content is relatively low is larger than the critical surface tension at the surface of a portion whose fluoride content is relatively high. In other words, the portion whose fluoride content is relatively low is more lyophilic than the portion whose fluoride content is relatively high. Accordingly, formation of a pattern constituted of portions whose fluoride content is relatively low as compared with the surrounding surface unit formation of a pattern constituted of lyophilic portions in a liquid-repellent area.

Accordingly, when the wetting-property-modifiable layer is used, a pattern constituted of lyophilic portions can be easily formed within a liquid-repellent area, by pattern-irradiating energy to the wetting-property-modifiable layer. Therefore, a functional portion can be easily formed only in the lyophilic area, whereby a functional element of excellent quality can be produced at a relatively low cost.

Regarding the fluoride content in the wetting-property-modifiable layer which contains fluoride, the fluoride content in the low-fluoride, lyophilic area formed by energy irradiation is, when the fluoride content at the non-energy irradiated portion is expressed as 100, no higher than 10, and preferably no higher than 5, and more preferably no higher than 1.

By setting the fluoride content in the above-mentioned range, a significantly large difference in the wetting property can be created between the energy-irradiated portion and the non-energy irradiated portion. Accordingly, by forming a functional portion on such a wetting-property-modifiable layer, the functional portion can be formed accurately only in the lyophilic area whose fluoride content has been decreased, whereby a functional element can be obtained in a highly precise manner. It should be noted that rate of decrease in the fluoride content is calculated on the basis of weight.

Measurement of the fluoride content in the wetting-property-modifiable layer can be carried out by using various conventional methods, such as X-ray Photoelectron Spectroscopy, ESCA (Electron Spectroscopy for Chemical Analysis), fluorescent X-ray Spectroscopy and Mass Spectroscopy. In short, the method is not particularly restricted as long as the method allows the quantitative measurement of the fluoride content at a sample surface.

The type of the material used in the above-mentioned wetting-property-modifiable layer is not particularly restricted, as long as: the characteristic (i.e, the wetting property) of the wetting-property-modifiable layer is modified by exposure, due to the action of the photocatalyst present in the photocatalyst-containing layer which is in contact with the wetting-property-modifiable layer; and the material contains a component having a main chain which is less likely to deteriorate or be decomposed by the action of the photocatalyst. Examples of such a material include:

(1) organopolysiloxane which is produced by hydrolysis and polycondensation of chlorosilane or alkoxysilane by a sol-gel reaction and has a significantly high strength; and (2) organopolysiloxane such as that in which a reactive silicone excellent in water-repellency and oil-repellency has been cross-linked.

In the case of the aforementioned (1), the material is preferably organopolysiloxane obtained as a result of hydrolysis condensation or cohydrolysis condensation of at least one type of silicon compound represented by the general formula:

$$Y_n SiX_{(4-n)}$$

wherein Y represents a group selected from the group consisting of the alkyl group, the fluoroalkyl group, the vinyl group, the amino group, the phenyl group and the epoxy group, X represents the alkoxyl group, the acetyl group or the halogen group, and n represents an integer of 0 to 3.

The number of the carbon atom of the group represented by Y is preferably in a range of 1 to 20. Further, the alkoxy group represented by X is preferably the methoxy group, the ethoxy group, the propoxy group or the butoxy group.

Organopolysiloxane containing the fluoroalkyl group, in particular, can be preferably used. Specific examples thereof include hydrolysis condensates or cohydrolysis condensates of one type, or more than two types in combination, of the fluoroalkylsilane described below. In general, those conventionally known as the fluorine-based silane coupling agent can be used.

By using polysiloxane including the above-mentioned fluoroalkyl group as the binder, the liquid-repellency of the unexposed portion of the wetting-property-modifiable layer is significantly enhanced. For example, in a case in which the functional element is a color filter, the unexposed portion of the wetting-property-modifiable layer excellently prevents the composition for the functional portion, such as ink for coloring pixel portions, from attaching thereto.

$CF_3(CF_2)_3CH_2CH_2Si(OCH_3)_3$;
$CF_3(CF_2)_5CH_2CH_2Si(OCH_3)_3$;
$CF_3(CF_2)_7CH_2CH_2Si(OCH_3)_3$;
$CF_3(CF_2)_9CH_2CH_2Si(OCH_3)_3$;
$(CF_3)_2CF(CF_2)_4CH_2CH_2Si(OCH_3)_3$;
$(CF_3)_2CF(CF_2)_6CH_2CH_2Si(OCH_3)_3$;
$(CF_3)_2CF(CF_2)_8CH_2CH_2Si(OCH_3)_3$;
$CF_3(C_6H_4)C_2H_4Si(OCH_3)_3$;
$CF_3(CF_2)_3(C_6H_4)C_2H_4Si(OCH_3)_3$;
$CF_3(CF_2)_5(C_6H_4)C_2H_4Si(OCH_3)_3$;
$CF_3(CF_2)_7(C_6H_4)C_2H_4Si(OCH_3)_3$;
$CF_3(CF_2)_3CH_2CH_2SiCH_3(OCH_3)_2$;
$CF_3(CF_2)_5CH_2CH_2SiCH_3(OCH_3)_2$;
$CF_3(CF_2)_7CH_2CH_2SiCH_3(OCH_3)_2$;
$CF_3(CF_2)_9CH_2CH_2SiCH_3(OCH_3)_2$;
$(CF_3)_2CF(CF_2)_4CH_2CH_2SiCH_3(OCH_3)_2$;
$(CF_3)_2CF(CF_2)_6CH_2CH_2SiCH_3(OCH_3)_2$;
$(CF_3)_2CF(CF_2)_8CH_2CH_2SiCH_3(OCH_3)_2$;
$CF_3(C_6H_4)C_2H_4SiCH_3(OCH_3)_2$;
$CF_3(CF_2)_3(C_6H_4)C_2H_4SiCH_3(OCH_3)_2$;
$CF_3(CF_2)_5(C_6H_4)C_2H_4SiCH_3(OCH_3)_2$;
$CF_3(CF_2)_7(C_6H_4)C_2H_4SiCH_3(OCH_3)_2$;
$CF_3(CF_2)_3CH_2CH_2Si(OCH_2CH_3)_3$;
$CF_3(CF_2)_5CH_2CH_2Si(OCH_2CH_3)_3$;
$CF_3(CF_2)_7CH_2CH_2Si(OCH_2CH_3)_3$;
$CF_3(CF_2)_9CH_2CH_2Si(OCH_2CH_3)_3$; and
$CF_3(CF_2)_7SO_2N(C_2H_5)C_2H_4CH_2Si(OCH_3)_3$ Further, examples of the reactive silicone of the aforementioned (2) include a compound having a skeleton represented by the general formula below.

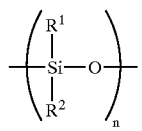

wherein n is an integer of 2 or more, $R^1$, $R^2$ represents a $C_1$–$C_{10}$ group selected from the group consisting of substituted or unsubstituted alkyl, alkenyl, aryl and cyanoalkyl groups. No more than 40%, in mole ratio, of the whole compound is constituted of vinyl, phenyl or phenyl halide. The compound in which $R^1$ and $R^2$ are the methyl group is preferable because the surface energy thereof can be reduced to the smallest level. It is preferable that the compound contains no less than 60%, in mole ratio, of the methyl group. The molecular chain includes at least one reactive group such as the hydroxyl group at the chain end or a side chain.

A stable organosilicone compound such as dimethylpolysiloxane, which does not effect a cross-linking reaction, may further be added to the above-mentioned organopolysiloxane.

In the present invention, various materials such as organopolysiloxane can be used as the material of the wetting-property-modifiable layer. As described above, making the wetting-property-modifiable layer contain fluorine is effective for forming a wetting-property-based pattern. Therefore, it is preferable that making, a material which is less likely to deteriorate or be discomposed by the action of the photocatalyst, contain fluorine, or more specifically, making an organopolysiloxane material contain fluorine to produce a wetting-property-modifiable layer, is preferable.

Examples of the method of making the organopolysiloxane material contain fluoride include; a method of making a fluorine compound be bound, with relatively low bonding energy, to the main agent having generally a high bonding energy; a method of mixing a fluorine compound, which is bound with relatively low bonding energy, into a wetting-property-modifiable layer. In the organopolysiloxane material into which fluorine has been introduced by these methods, the fluorine bonding site at which the bonding energy is relatively low is first decomposed upon irradiation of energy, whereby fluorine can be removed from the wetting-property-modifiable layer.

Examples of the first method i.e., the method of making a fluorine compound be bound, with relatively low bonding energy, to the main agent having generally a high bonding energy include the method of introducing the fluoroalkyl group as a substituent into the organopolysiloxane.

In order to obtain organopolysiloxane, as described in the aforementioned (1), for example, organopolysiloxane having high strength can be obtained by hydrolysis and polycondensation of chlorosilane or alkoxysilane by utilizing a sol-gel reaction. In this method, organopolysiloxane is obtained as a result of hydrolysis condensation or cohydrolysis condensation of at least one type of silicon compound represented by the general formula:

$Y_n SiX_{(4-n)}$ wherein Y represents a group selected from the group consisting of the alkyl group, the fluoroalkyl group, the vinyl group, the amino group, the phenyl group and the epoxy group, X represents the alkoxyl group, the acetyl group or the halogen group, and n represents an integer of 0 to 3. In the aforementioned general formula, when the synthesis is carried out by using a silicon compound having a fluoroalkyl group as the substituent Y, organopolysiloxane including the fluoroalkyl group as the substituent can be obtained. In a case in which such organopolysiloxane including the fluoroalkyl group as the substituent is used as the binder, the carbon bonding site of the fluralkyl group is decomposed, upon irradiation of energy, by the action of the photocatalyst present in the photocatalyst-containing layer which is in contact with the wetting-property-modifiable layer, whereby the fluorine content of the energy-irradiated portion of the wetting-property-modifiable layer can be reduced.

The type of the silicon compound having the fluoroalkyl group used here is not particularly restricted as long as the silicon compound has a fluoroalkyl group. A silicon compound which has at least one fluoroalkyl group and the number of the carbon atoms of each fluoroalkyl group is in a range of 4 to 30 (preferably in a range 6 to 20 and more preferably in a range of 6 to 16) is preferably used. Specific examples of such a silicon compound are as described above. Among the examples, the silicon compound having a $C_6$–$C_6$ fluoroalkyl group, that is, fluoroalkylsilane, is preferable.

In the present invention, the silicon compound having the above-mentioned fluoroalkyl group may be mixed with the silicon compound not having the above-mentioned fluoroalkyl group and the cohydrolysis condensates thereof may be used as the organopolysiloxane. Alternatively, one type or more than one type of the silicon compound having the above-mentioned fluoroalkyl group may be used so that the hydrolysis condensate or cohydrolysis condensate thereof is used as the organopolysiloxane.

In the organopolysiloxane having the fluoroalkyl group, which has been obtained as described above, it is preferable that the mole ratio of the silicon compound having the fluoroalkyl group with respect to all the silicon compounds constituting the organopolysiloxane is preferably 0.01 mol % or more, or more preferably 0.1 mol %.

When the content (mole ratio) of the fluroalkyl group contained in the organopolysiloxane is within the above-mentioned range, the liquid-repellency at the wetting-property-modifiable layer can be enhanced, whereby the difference in the wetting property between the liquid-repellent portion and the energy-irradiated, lyophilic area can be increased.

In the method described in the aforementioned (2), organopolysiloxane is obtained by cross-linking of a reactive silicone which exhibits excellent liquid-repellency. In this method, as is in the method of the aforementioned (1), by designing at least one of $R_1$, $R_2$ in the aforementioned general formula as a substituent group containing fluorine such as the fluoroalkyl group, it is possible to make the wetting-property-modifiable layer contain fluorine. Further, in this method, the portion of the fluoroalkyl group whose bonding energy is lower than that of the siloxane bonding is decomposed upon irradiation of energy. Accordingly, the fluorine content at the surface of the wetting-property-modifiable layer can be decreased by irradiation of energy.

On the other hand, examples of the latter method i.e., the method of introducing (mixing) a fluorine compound whose bonding energy is lower than the bonding energy of the binder include: a method of mixing a fluorine-based surfactant (in a case in which a low molecular weight fluorine compound is introduced); and mixing a fluorine resin which is highly compatible with the binder resin (in a case in which a high molecular weight fluorine compound is introduced).

The wetting-property-modifiable layer of the present invention may further include a surfactant. Specific examples thereof include: a hydrocarbon-based non-ionic surfactant such as NIKKOL BL, BC, BO, BB series manufactured by NIKKO CHEMICALS; a fluorine or silicone-based non-ion surfactant such as ZONYL FSN, FSO manufactured by DuPont Co., Ltd., Surflon S-141, 145 manufactured by Asahi Glass, Megafac-141, 144 manufactured by Dainippon Ink & Chemicals, Futargent F-200, F251 manufactured by Neos Co., Ltd., Unidyne DS-401, 402 manufactured by Daikin Industries, and Frorard FC-170, 176 manufactured by 3M Co., Ltd; a cationic surfactant; an anionic surfactant; and an arpholytic surfactant.

The wetting-property-modifiable layer may further include, in addition to the above-mentioned surfactants, oligomer or polymer of polyvinyl alcohol, unsaturated polyester, acrylic resin, polyethylene, diarylphthalate, ethylenepropylenediene monomer, epoxy resin, phenol resin, polyurethane, melamine resin, polycarbonate, polyvinyl chloride, polyamide, polyimide, styrenebutadiene rubber, chloroprene rubber, polypropylene, polybutylene, polystyrene, polyvinyl acetate, polyester, polybutadiene, polybenzimidazol, polyacrylonitril, epichlorohydrine, polysulfide, and polyisoprene.

The wetting-property-modifiable layer as described above can be formed by: preparing a coating solution by dispersing the above-mentioned components, and optionally other additives, to a solvent; and applying the coating solution, by coating, to a substrate. As the solvent to be used, an alcohol-based organic solvent such as ethanol, isopropanol is preferable. The coating process may be carried out by any of known coating methods such as spin coating, spray coating, dip coating, roll coating and bead coating. In a case in which a UV hardening type component is contained in the composition, the wetting-property-modifiable layer can be formed by carrying out the hardening process by irradiating ultraviolet.

In the present invention, the thickness of the wetting-property-modifiable layer is preferably in a range of 0.001 to 1 $\mu$m, and more preferably in a range of 0.01 to 0.1 $\mu$m, in consideration of the rate of modification of the wetting property effected by the photocatalyst.

In the present invention, in which the wetting-property-modifiable layer containing the above-mentioned components is used, the wetting property of the exposed portion of the wetting-property-modifiable layer can be rendered lyophilic by the action of the photocatalyst present in the photocatalyst-containing layer being in contact with the wetting-property-modifiable layer (or more specifically, by oxidization, decomposition and the like, induced by the photocatalytic effect, of the organic group and the additives as a part of the aforementioned components). As a result, there can be created a significantly large difference in the wetting property between the exposed and unexposed portions of the wetting-property-modifiable layer. Accordingly, by enhancing the compatibility (lyophilicity) and the repellency (liquid-repellency) of the wetting-property-modifiable layer with respect to the composition for a functional portion (such as ink for coloring pixel portions), a functional element such as a color filter, which is of excellent quality and advantageous in cost reduction, can be obtained.

The type of the wetting-property-modifiable layer used in the present invention is not particularly restricted as long as the wetting property of the layer is modified by the action of the photocatalyst as described above. However, a layer which does not contain photocatalyst is especially preferable. In the case of the wetting-property-modifiable layer which contains no photocatalyst, there is no possibility that the wetting-property-modifiable layer, when the layer is used as a functional element, deteriorates as time elapses and thus the layer can be used for a long period without any trouble.

The above-mentioned wetting-property-modifiable layer is generally formed on a substrate. However, in the present invention, the wetting-property-modifiable layer may be formed of a self-supporting material, so as not to include a substrate.

In the present invention, "being self-supporting" unit that a structure is capable of existing in a clearly shaped state without being supported by other members.

Specific examples of the material of the wetting-property-modifiable layer used in the present invention include a material in which a contact angle, formed by a liquid having the same surface tension as that of the composition for the functional portion applied at a later stage, changes by at least 1°, preferably at least 5°, and more preferably at least 10°, by irradiating energy in a state in which the photocatalyst-containing layer is in contact with the wetting-property-modifiable layer.

It is necessary that the wetting-property-modifiable layer is made of a material which transmits the irradiated energy.

Examples of such a material include polyethylene, polycarbonate, polypropylene, polystyrene, polyester, polyvinylfluoride, acetal resin, nylon, ABS, PTFE, methacryl resin, phenol resin, polyvinylidene fluoride, polyoxymethylene, polyvinyl alcohol, polyvinyl chloride, polyethylene terephthalate, silicone and the like.

(Decomposable and Removable Layer)

Next, the decomposable and removable layer will be described. The decomposable and removable layer is a layer whose exposed portion is decomposed and removed, at time of exposure, by the action of the photocatalyst in the photocatalyst-containing layer.

That is, the exposed portion of the decomposable and removable layer is decomposed and removed by the action of the photocatalyst. Therefore, a pattern constituted of a portion having the decomposable and removable layer and a portion not having the decomposable and removable layer i.e., a pattern having recesses and projections can be formed without carrying out the development or washing process. Accordingly, a member which necessitates a recess-projection pattern, such as a printing plate of various types, can be easily formed by this method. Further, by applying this decomposable and removable layer to a screen by coating and effecting pattern-exposure in a state in which the screen is in contact with the photocatalyst-containing-layer side substrate, thereby decomposing and removing the decomposable and removable layer of the exposed portion, an original plate for screen printing can be formed without carrying out the development and/or washing process. Further, in a case in which the decomposable and removable layer is made of a material having photoresist characteristic, a pattern of the photoresist can be easily formed by effecting pattern exposure in a state in which the decomposable and removable layer is in contact with the photocatalyst-containing-layer side substrate. Accordingly, such a decomposable and removable layer can be employed as a photoresist which does not necessitate either development or washing process, in the semiconductor producing process and the like.

The decomposable and removable layer is oxidized and decomposed by the action of the photocatalyst at the time of exposure and eventually vaporized. That is, the decomposable and removable layer is removed without carrying out any specific post-treatment such as developing and/or washing process. However, the washing process and the like may be carried out, depending on the material of the decomposable and removable layer.

In the case of employing the decomposable and removable layer, a pattern can be formed by not only creating recess and projections at the layer surface but also utilizing the difference in the surface characteristic between the decomposable and removable layer and the base material exposed as a result of decomposition and removal of the layer. Examples of such a surface characteristic include various characteristics like the attaching property and the color-developing property. In the present invention, the wetting property is raised, in particular, as the useful surface characteristic. Forming a pattern on the basis of the difference in the wetting property is preferable in terms of the effectiveness when an element is finally formed.

In short, in the present invention, it is preferable that the decomposable and removable layer is designed such that a contact angle formed by a liquid on the decomposable and removable layer is different from a contact angle formed by the same liquid on the substrate exposed as a result of decomposition-removal of the decomposable and removable layer. It is especially preferable that a contact angle formed by a liquid on the decomposable and removable layer is larger than a contact angle formed by the same liquid on the substrate.

Regarding the liquid-repellency required at the surface of the decomposable and removable layer, the liquid-repellency, as expressed as a contact angle formed by a liquid having the same surface tension as that of the composition for the functional portion applied by coating at a later stage, is to be at least 30°, preferably at least 40°, and more preferably at least 50°.

Specific examples of the material which can be preferably used for the decomposable and removable layer include a functional thin film i.e., a Self-Assembled Monolayer Film, a Langmuir-Blodgett's Film and a Layer-by-Layer Self-Assembled Film. A fluorine-base resin can also be used for the decomposable and removable layer.

A detailed description will be given hereinafter regarding the Self-Assembled Monolayer Film, the Langmuir-Blodgett's Film and the Layer-by-Layer Self-Assembled Film used in the present invention.

(a) Self-Assembled Monolayer Film

The official definition of a Self-Assembled Monolayer Film, if it exists, is not known to the inventors. Examples of the excellent text of what is generally identified as a "Self-Assembled Monolayer Film" include "Formation and Structure of Self-Assembled Monolayers" by Abraham Ulman, Chemical Review, 96, 1533–1554 (1996). Referring to this text, a Self-Assembled Monolayer Film is a monolayer generated as a result of adsorption and bonding of suitable molecules on a suitable substrate surface (self-assembling of molecules). Examples of a material capable of forming a self-assembled layer include surfactant molecules such as fatty acids, organic silicon molecules such as alkyltrichlorosilanes and alkylalkoxides, organic sulfur molecules such as alkanethiols, and organic phosphoric molecules such as alkylphosphates. The common characteristics, in general, in the molecule structures of the above-mentioned compounds is that each type of molecule has a relatively long alkyl chain and a functional group located at one molecular end, which functional group interacts the substrate surface. The alkyl chain portion is the source of the intermolecular force at the time of packing of molecules in the two-dimensional manner. Note that the structures exemplified herein is the simplest ones and the reported examples of a Self-Assembled Monolayer Film include those composed of various molecules, such as: a Self-Assembled Monolayer Film having a functional group like the amino group or the carboxyl group at the other end of the molecule; a Self-Assembled Monolayer Film whose alkylene chain portion is the oxyethylene chain; a Self-Assembled Monolayer Film whose alkylene chain portion is the fluorocabon chain; a Self-Assembled Monolayer Film whose alkylene chain portion is a composite chain of the oxyethylene chain and the fluorocarbon chain. A composite-type Self-Assembled Monolayer Film constituted of plural types of molecular species is also acceptable. In recent years, a structure in which polymers of particulate shape including a plurality of functional groups (there may be a case, however, in which only one functional group is included) typically represented by Dentrimer are provided as monolayer on a substrate surface, and a structure in which polymers of normal chain (there may be a case, however, in which chains are branched) are provided as monolayer on a substrate surface (this structure is generally referred to as a "polymerbrush"), are also regarded as Self-Assembled Monolayer Film by some researchers. The present invention includes these two structures (the polymer brush etc.,) into the category of Self-Assembled Monolayer Film.

(b) Langmuir-Blodgett's Film

The Langmuir-Blodgett's Film used in the present invention, after being formed on a substrate, is not so significantly different in shape thereof from the above-mentioned Self-Assembled Monolayer Film. The unique feature of the Langmuir-Blodgett's Film resides in the method of forming the film and the excellent, two-dimensional molecular packing property (excellent orientation, excellent order) resulted from the method. Specifically, the molecules for forming the Langmuir-Blodgett's Film are in general developed on a gas-liquid interface first and the developed film is condensed by trough, whereby the developed film is modified to a condensed film which has been highly packed. In practice, the condensed film is transferred to an appropriate substrate for use. A Langmuir-Blodgett's Film of various types, including the monolayer type and the multi-layered film comprising desired molecular layers, can be formed by the method schematically described herein. Further, not only low-molecular weight materials, but also macro molecular materials and colloidal particles may also be used as the film material. Regarding the recent cases in which various materials have been applied, detailed description can be found in the text "Prospect of Nanotechnology created by Soft-based Nanodevice", Macro Molecule, vol. 50, September, 644–647 (2001).

(c) Layer-by-Layer Self-Assembled Film

The Layer-by-Layer Self-Assembled Film is generally a film formed by successively, in the laminating manner, providing a material having at least two positively or negatively charged functional groups on a substrate by adsorption and bonding. As a material having many functional groups is advantageous in terms of the strength and durability of the film, ionic polymers (high polymer electrolytes) are often used as the material, recently. Particles having surface charge such as protein, metal or oxide, what is called "colloidal particles" are also often used as a film-forming substance. More recently, films which make the best use of the interactions weaker than the ionic bond, such as hydrogen band, coordinate bond, hydrophobic interaction, have been reported. Regarding the relatively recent applications of the Layer-by-Layer Self-Assembled Film, detailed description can be found in "Recent Explorations in Electrostatic Multilayer Thin Film Assembly" by Paula, T. Hammond, *Current Opinion in Colloid & Interface Science*, 4, 430–442 (2000), although the applications therein are slightly biased to the material systems which utilize electrostatic interaction as the driving force. The Layer-by-Layer Self-Assembled Film is, when the simplest process for formation thereof is taken as an example, a layer formed by repeating, predetermined times, the cycle of; adsorption of the material having positive (negative) charge; washing; adsorption of the material having negative (positive) charge; and washing, In the Layer-by-Layer Self-Assembled Film, there is no necessity of carrying out an operation of development, condensation and transfer, as is required in the Langmuir-Blodgett's Film. As is obvious from the difference in the film-forming process between these two methods, the Layer-by-Layer Self-Assembled Film generally does not exhibit the two-dimensional, excellent orientation and order as the Langmuir-Blodgett's Film has. However, the Layer-by-Layer Self-Assembled Film and the production process thereof have a lot of advantages which the conventional film-forming methods lack, which advantages include that a flawless and dense layer can be easily formed and that a layer can be formed evenly even on a surface having minute recesses and projections, the inner surface of a tube, a sphere surface and the like.

The thickness of the decomposable and removable layer is not particularly restricted as long as the layer thickness is thin enough to be decomposed and removed by the energy irradiated in the energy irradiating process described below. In general, the specific layer thickness is preferably in a range of 0.001 to 1 $\mu$m, and more preferably in a range of 0.01 to 0.1 $\mu$m, although the thickness may significantly vary depending on the type of the irradiated energy and the material of the decomposable and removable layer.

(2) Substrate

In the method of producing a pattern-formed structure of the present invention, the characteristic-modifiable layer is preferably formed on a substrate 4, as shown in FIG. 1, in order to gain sufficient strength thereof and ensure good performance of the eventually obtained functional element. Examples of the substrate include, depending on the state of application of the pattern-formed structure or the functional element produced by using the pattern-formed structure, glass, metal such as aluminum and an alloy thereof, plastic, woven cloth, and unwoven cloth.

3. Pattern Forming Process

In the present invention, the photocatalyst-containing layer and the characteristic-modifiable layer are then disposed so as to have a gap therebetween of no larger than 200 $\mu$m, but not to be in contact with each other. Thereafter, a pattern forming process is carried out in which energy is irradiated from a predetermined direction.

By arranging the photocatalyst-containing layer and the characteristic-modifiable layer so as to have a gap or space of a predetermined distance therebetween, oxygen, water and active oxygen species generated by the action of the photocatalyst can be easily removed/attached. Specifically, if the gap between the photocatalyst-containing layer and the characteristic-modifiable layer is narrower than the above-mentioned range, there is a possibility that removal/attachment of the aforementioned active oxygen species is disturbed and thus the rate of modification of the characteristic is slowed, which is not desirable. If the gap between the photocatalyst-containing layer and the characteristic-modifiable layer is wider than the above-mentioned range, the generated active oxygen species is significantly prevented from reaching the characteristic-modifiable layer and thus the rate of modification of the characteristic may be slowed, which is not desirable, either.

In the present invention, the above-mentioned gap is preferably in a range of 0.2 to 10 $\mu$m, and more preferably in a range of 1 to 5 $\mu$m, in order to achieve very good pattern precision and sufficiently high sensitivity of the photocatalyst, which results in highly efficient modification of the characteristic. The gap or distance of the above-mentioned range is especially effective in a substrate for a pattern-formed structure having a small area, in which the above-mentioned gap can be controlled with high precision.

On the other hand, in the case of a substrate for a pattern-formed structure having a large area (300 mm×300 mm, for example), it is extremely difficult to provide such a minute gap as described above between the photocatalyst-containing layer and the characteristic-modifiable layer and prevent any contact between the two layers. Accordingly, when a substrate for a pattern-formed structure has a relatively large area, the above-mentioned gap between the two layers is set preferably in a range of 10 to 100 $\mu$m, and more preferably in a range or 50 to 75 $\mu$m. When the gap is set within such a range, there do not arise problems such as deterioration of pattern precision (blurred patterns, for example), deterioration of efficiency in the characteristic modification (due to the deterioration of sensitivity of the photocatalyst) and unevenness in the characteristic modification at the characteristic-modifiable layer.

When a substrate for a pattern-formed structure having a relatively large area is exposed, the setting of the gap, at the aligning device in the exposure device, between a photocatalyst-containing-layer side substrate and a substrate for a pattern-formed structure is preferably in a range of 10 to 200 $\mu$m, and more preferably in a range of 25 to 75 $\mu$m. When the set value of the gap is within the above-mentioned range, arrangement of the photocatalyst-containing-layer side substrate and the substrate for a pattern-formed structure can be carried out appropriately, without causing significant deterioration of pattern precision, significant deterioration of the sensitivity of the photocatalyst, and any contact between the photocatalyst-containing-layer side substrate and the substrate for a pattern-formed structure.

In the present invention, it suffices that the arrangement of the photocatalyst-containing-layer side substrate and the substrate for a pattern-formed structure with a gap of the above-described range therebetween is maintained only during the exposure process.

As a method of arranging the photocatalyst-containing layer and the characteristic-modifiable layer with an extremely narrow and even gap or space therebetween, a method of using a spacer can be raised. By using such a spacer, an even gap or space can be maintained between the two layers. Further, the action of the photocatalyst does not reach the surface of the portion of the characteristic-modifiable layer at which portion the spacer is in contact with the characteristic-modifiable layer. Therefore, by designing the spacer so as to have the same pattern as the above-mentioned pattern, a predetermined pattern can be formed on the characteristic-modifiable layer.

In the present invention, the spacer may be formed as one independent or separate member. However, as is described in the explanation of the photocatalyst-containing-layer side substrate, in order to make the production process simpler, it is preferable that the spacer is formed on the surface of the photocatalyst-containing layer of the photocatalyst-containing-layer side substrate, so as to function as both spacer and light-shielding portion. In the abovementioned explanation, the spacer has the function of the light-shielding portion. However, in the present invention, the spacer may be formed of the material not to have the function of shielding the irradiated energy, because the spacer is enough to have the function not to affect the portion of the characteristic-modifiable layer underneath the spacer.

Next, in a state in which the photocatalyst-containing layer faces the characteristic-modifiable layer with a gap therebetween, energy irradiation is carried out to the facing portions of these two layers. In the present invention, the term "energy irradiation (exposure)" represents any conception of energy irradiation which can cause the photocatalyst-containing layer to modify the characteristic of the characteristic-modifiable layer and is not restricted to irradiation of visual light.

The wavelength of light used in such exposure is generally set in a range of 400 nm or less, and preferably in a range of 380 nm or less, because the preferable photocatalyst used in the photocatalyst-containing layer is titanium dioxide as described above and light having wavelength within the aforementioned range is preferable as energy for activating the photocatalytic effect by titanium dioxide.

Examples of the light source which can be used for such exposure include mercury lamp, metal halide lamp, xenon lamp, eximer lamp and other light source of various types.

In addition to the method of effecting pattern irradiation by using the above-mentioned light source by way of a photomask, the method of carrying out drawing irradiation according to a pattern by using a laser such as eximer, YAG or the like, is also acceptable.

The amount of energy irradiation during exposure is set at the amount of irradiation which is necessary for causing the photocatalyst in the photocatalyst-containing layer to act on the surface of the characteristic-modifiable layer, thereby to modify the characteristic at the surface of the characteristic-modifiable layer.

It is preferable that the photocatalyst-containing layer is heated during exposure because the sensitivity can be increased and thus modification of the characteristic can be effected efficiently. Specifically, it is preferable that heating of the photocatalyst-containing layer is carried out in a range of 30° to 80°.

In the present invention, the direction in which exposure is performed is determined in consideration of the pattern forming method (whether or not the light-shielding portion is formed on the photocatalyst-containing-layer side substrate) and whether the photocatalyst-containing-layer side substrate or the substrate for a pattern-formed structure is transparent or not.

In short, in a case in which the light-shielding portion is formed in the photocatalyst-containing-layer side substrate, exposure needs to be done from the side of the photocatalyst-containing-layer side substrate and the photocatalyst-containing-layer side substrate needs to be transparent with respect to energy. In this case, if the light-shielding portion is formed on the photocatalyst-containing layer so as to function as a spacer, as well, the direction in which exposure is effected may be from either the side of the photocatalyst-containing-layer side substrate or the side of the substrate for a pattern-formed structure.

Further, in a case in which the photocatalyst-containing layer is formed in a pattern-like configuration, exposure may be effected from any direction, as described above, as long as energy is irradiated to the facing portions of the photocatalyst-containing layer and the characteristic-modifiable layer.

Similarly, in a case in which the above-mentioned spacer is used, energy may be irradiated from any direction, as long as energy is irradiated to the facing portions of the photocatalyst-containing layer and the characteristic-modifiable layer.

In a case in which a photomask is used, energy is irradiated from the side at which the photomask has been arranged. In this case, the substrate on which the photomask has been arranged (i.e., the photocatalyst-containing-layer side substrate or the substrate for a pattern-formed structure) needs to be transparent.

Figure 1D:
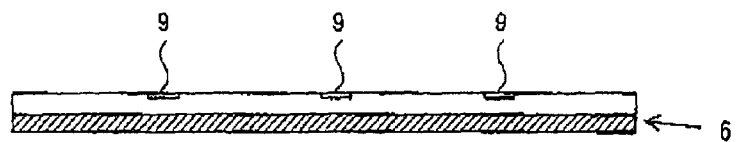

When the energy irradiation as described above has been completed, the photocatalyst-containing-layer side substrate is removed from the position at which the photocatalyst-containing-layer side substrate was facing the characteristic-modifiable layer, whereby a pattern constituted of the characteristic-modifiable area 9 in which the characteristic has been modified is formed on the characteristic-modifiable layer 5 as shown in FIG. 1D.

The type of the modification of the characteristic of the characteristic-modifiable layer surface in the pattern forming process can be classified into two main categories. One type of the modification is to modify the characteristic at the surface of the characteristic-modifiable layer, and the other type of the modification is to remove some portions thereof.

Specifically, in the case in which the characteristic of the characteristic-modifiable layer surface is modified, the compound at the characteristic-modifiable layer surface is modified by the action of the photocatalys, whereby the chemical and/or physical characteristics of the compound are changed. For example, when the resistivity value at the surface is to be changed, such a change can be achieved by modifying the chemical activity of the surface, modifying the adhesion property at the surface or by other methods. Specifically, the above-mentioned wetting-property-modifiable layer is one typical example thereof.

On the other hand, the cases in which the characteristic-modifiable layer is removed by the action of the photocatalyst induced by energy irradiation are also included into modification of the characteristic of the characteristic-modifiable layer of the present invention. Examples of these cases include: the case in which the characteristic-modifiable layer on the substrate is removed only at the energy-irradiated portions thereof; the case in which recesses are formed at the characteristic-modifiable layer surface only at the energy-irradiated portions thereof; the case in which removal of the characteristic-modifiable layer surface occurs locally as a result of energy irradiation, whereby recesses and projections are created at the surface; and the like. The typical example of these cases is the above-mentioned decomposable and removable layer.

4. Functional Element

A pattern-formed structure can be obtained by forming a pattern, produced as a result of modification of the characteristic, on the above-mentioned substrate for a pattern-formed structure. Then, functional elements of various types can be produced by attaching a composition for forming a functional portion to the obtained pattern of the pattern-formed structure.

Such functional elements have the characteristic in that the functional portion thereof is formed according to the above-mentioned pattern of the pattern-formed structure.

Here, the term "a functional portion" represents that the portion can effect various functions including: optical functions (such as light-selective absorption, reflection, polarization, light-selective transmittance, non-linear optical character, luminescence like fluorescence or phosphorescence, and photochromism); magnetic functions (such as hard magnetic, soft magnetic, non-magnetic functions, magnetism-transmittance); electric/electronic functions (such as electrical conductivity, insulation, piezoelectricity, pyroelectricity, dielectric function); chemical functions (such as adsorption, desorpion, catalytic function, hydrophilicity, ion-conductivity, oxidizing/reducing function, electrochemical characteristic, electrochromic); mechanical functions (such as wear resistance); thermal functions (heat transmitting property, adiathermancy, infrared radiation); and biodynamical functions (such as biocompatibility, anti-thrombogenic function).

The arrangement of the functional portion as described above to the site corresponding to the pattern of the pattern-formed structure is carried out by a method utilizing difference in the wetting property or the adhesion property between the lyophilic and liquid-repellent areas.

For example, in the case in which difference in the adhesion property between the wetting-property based pattern and other portions of the wetting-property-modifiable layer is utilized, by vapor-depositing metal as the composition for the functional portion on the whole surface of the wetting-property-modifiable layer and then peeling the vapor-deposited metal by using an adhesive or the like, a pattern of metal as the functional portion is formed only in the lyophilic area in which the vapor-deposited metal is firmly attached to the wetting-property-modifiable layer. A printed wiring board and the like can be easily produced by this method.

In the case in which difference in the wetting property between the wetting-property based pattern and other portions of the wetting-property-modifiable layer is utilized, when the composition for the functional portion is coated on the pattern-formed structure, the composition for the functional portion is attached only to the lyophilic area which exhibits excellent wetting property, whereby the functional portion can be arranged easily only at the pattern of the lyophilic area of the pattern-formed structure.

As described above, the type of the composition for the functional portion used in the present invention significantly varies depending on the function and the forming method of the functional element. For example, in the above-mentioned case in which a pattern of metal is formed by utilizing difference in the adhesion property, the composition of the functional portion is a metal. In the above-mentioned case in which a pattern is formed by utilizing difference in the wetting property, a composition which has not been diluted by a solvent (typically represented by UV-hardening monomer) or a composition which has been diluted by a solvent (i e., in a form of liquid) can be used as the composition of the functional portion.

In the case of the liquid composition diluted with a solvent, the solvent is preferably that which exhibits high surface tension such as water or ethyleneglycol. Regarding the composition for the functional portion, a composition having the lower viscosity is the more preferable because the more quickly a pattern can be formed. However, in the case of the liquid composition diluted with a solvent, as the viscosity increases and thus the surface tension is changed at the time of pattern forming, due to volatilization of the solvent, it is preferable that the solvent is low volatile.

The composition for the functional portion used in the present invention may directly constitute the functional portion by being attached and arranged on the pattern-formed structure. Alternatively, the composition for the functional portion may constitute the functional portion by being arranged on the pattern-formed structure and then treated with a chemical, ultraviolet, heat or the like. Here, the composition for the functional portion containing a component which is hardened by ultraviolet, heat, electron beam or the like as a binder is preferable because the functional portion can be formed quickly by carrying out the hardening process.

The method of forming a functional element as described above will be described in detail hereinafter. For example, a functional portion can be formed on the pattern of the lyophilic-area at the surface of the pattern-formed structure, by coating the composition for the functional portion on the pattern-formed structure surface by using a coating unit such as dip coating, roll coating, blade coating and spin coating or a nozzle-discharge unit such as ink-jet.

Further, by applying the pattern-formed structure of the present invention to a metal film forming method according to elecroless plating, a functional element having a pattern of a metal film as the functional portion thereof can be obtained. Specifically, a functional element having a desired metal pattern on the wetting-property-modifiable layer can be obtained by: treating only the lyophilic area at the wetting-property-modifiable layer surface of the pattern-formed structure with preparation liquid for chemical plating, by utilizing the difference in the wetting property; and immersing the treated pattern-formed structure in a chemical plating solution. According to this method, a pattern of metal can be formed without necessity of forming a resist pattern. Therefore, by this method, a printed wiring board or an electric circuit element can be produced as a functional element.

Further, a functional portion may be formed according to a pattern, by arranging the composition for the functional portion on the whole surface of the characteristic-modifiable layer and then removing the composition at unnecessary portions by utilizing difference in the wetting property between the liquid-repellent and lyophilic areas. Specifically, a pattern of a functional portion can be obtained by utilizing difference in the adhesion property between the lyophilic and liquid repellent areas of the wetting-property-modifiable layer, for example, by removing the composition at the unnecessary portions by peeling closely attaching a sticky tape to the wetting-property-modifiable layer and then a peeling the tape off, air blowing, or post-treatment such as a treatment by a solvent.

In this method, it is necessary to arrange the composition for the functional portion on the whole surface of the wetting-property-modifiable layer of the pattern-formed structure of the present invention. Examples of the method of effecting such an arrangement include the vacuum film-forming method such as PVD, CVD.

Specific examples of the functional element obtained in a such manner include a color filter, a microlens, a print wiring board, an electric circuit element and the like.

5. Color Filter

A color filter is used in a liquid crystal display and the like. In a color filter, a plurality of pixel portions such as red, green and blue are formed on a glass substrate or the like in a highly precise pattern. By applying the pattern-formed structure of the present invention to production of a color filter, a highly precise color filter can be produced at a relatively low cost.

Specifically, the pixel portions (the functional portions) can be easily formed by attaching ink (the composition for the functional portion) to the above-mentioned lyophilic area of the pattern-formed structure, by way of an ink-jet device or the like, and hardening the ink. As a result, a color filter can be produced in a highly elaborate and precise manner by a production process including fewer number of processes.

In the present invention, the light-shielding portion of the aforementioned pattern-formed structure can be used as it is as a black matrix in the color filter. Accordingly, by forming pixel portions (colored portions) as a functional portion on the aforementioned pattern-formed structure of the present invention, a color filter can be obtained without necessity of forming a black matrix separately.

B. Photomask

Next, the photomask of the present invention will be described hereinafter. The photomask of the present invention can be realized by at least three embodiments.

A photomask of the first embodiment includes a transparent base material, a light-shielding portion pattern having thickness of 0.2 to 10 $\mu$m and formed, in a pattern-like configuration, on the transparent base material, and a photocatalyst-containing layer formed on the transparent base material and the light-shielding portion pattern. A specific example thereof is shown in FIG. 3.

In short, in the method of producing a pattern-formed structure of the present invention, the photocatalyst-containing-layer side substrate which includes the light-shielding portion can be used as a photomask, due to the functional feature thereof.

A photomask of the second embodiment includes a transparent base material, a photocatalyst-containing layer formed on the transparent base material, and a light-shielding portion pattern having thickness of 0.2 to 10 $\mu$m and formed, in a pattern-like configuration, on a photocatalyst-containing layer. A specific example thereof is shown in FIG. 4.

A photomask of the third embodiment includes a transparent base material, a light-shielding portion formed, in a pattern-like configuration, on the transparent base material, a primer layer formed on the transparent base material and the light-shielding portion, and the photocatalyst-containing layer formed on the primer layer. A specific example thereof is shown in FIG. 5.

As each element of any of the above-mentioned photomasks is basically the same as that described in the aforementioned "the method of forming a pattern-formed structure" and the effects achieved by the photomasks of the respective embodiments are basically the same as those described in the aforementioned "the method of forming a pattern-formed structure", the detailed description thereof will be omitted here.

It should be noted that the present invention is not restricted to the above-mentioned embodiments. These embodiments are simply examples and those having substantially the same structure as the technological thoughts described in claims of the present invention and achieving substantially the same effect are all included into the technological scope of the present invention.

EXAMPLES

The present invention will be described further in detail by the following examples, hereinafter.

Example 1

On a quartz glass substrate including a pattern as a chrome-made light-shielding portion, of 0.4 $\mu$m thickness and 100 $\mu$m line-and-space, formed on the substrate, a titanium oxide coating agent for photocatalyst (TKC301, manufactured by TEIKA Co., Ltd.) was applied by coating. The substrate was dried at 350° C. for 3 hours, whereby a photomask including a photocatalyst-containing layer (the photocatalyst-containing-layer side substrate) was obtained.

Next, 3 g of 0.1 N hydrochloric acid (aq) was added to 5 g of methyltrimethoxysilane and the mixture was stirred for 1 hour at the room temperature. The resulting solution was applied by coating on a glass substrate. The glass substrate was then dried at 150° C. for 10 minutes, whereby a wetting-property-modifiable layer was formed.

The photomask and the substrate for a pattern-formed structure obtained as described above were closely attached to each other and ultraviolet was irradiated by an extra-high pressure mercury lamp at the illumination intensity of 20 mW/cm$^2$ (365 nm) from the photomask side, whereby a wetting-property based pattern was formed at the surface of the wetting-property-modifiable layer. Here, the contact angle formed by water at the unexposed portion of the wetting-property-modifiable layer was 72° and it took 120 seconds for the contact angle formed by water at the exposed portion of the wetting-property-modifiable layer to decrease to 10° or smaller. The width of the unexposed portion at the wetting-property-modifiable layer surface was 95 $\mu$m and the width of the exposed portion at the wetting-property-modifiable layer surface was 105 $\mu$m.

Example 2

A pattern formation was carried out in the substantially same manner as that of example 1, except that the thickness of the chrome-made pattern-formed structure was 0.1 $\mu$m. As a result, it took 370 seconds for the contact angle formed by water at the exposed portion of the wetting-property-modifiable layer to decrease to 10° or smaller.

Example 3

A pattern formation was carried out in the substantially same manner as that of example 1, except that the light-shielding portion pattern of example 1 was replaced with a light-shielding portion pattern having thickness or 20 $\mu$m and made of a resin binder in which carbon black had been dispersed. As a result, it took 560 seconds for the contact angle formed by water at the exposed portion of the wetting-property-modifiable layer to decrease to 10° or smaller.

Example 4

A pattern formation was carried out in the substantially same manner as that of example 1, except that the photomask and the wetting-property-modifiable layer were not closely attached to each other, but a gap (10 $\mu$m) was set between the wetting-property-modifiable layer and the photocatalyst-containing layer formed on the light-shielding portion pattern. As a result, it took 120 seconds for the contact angle formed by water at the exposed portion of the wetting-property-modifiable layer to decrease to 10° or smaller. The width of the unexposed portion at the wetting-property-modifiable layer surface was 80 $\mu$m and the width of the exposed portion at the wetting-property-modifiable layer surface was 120 $\mu$m.

Example 5

On a photomask made of quartz glass including a pattern as a chrome-made light-shielding portion, of 0.4 $\mu$m thickness and 50 $\mu$m line-and-space, formed in the photomask, a coating solution for primer layer, which had been prepared by mixing the components of the composition described below and stirring the mixture at 25° C. for 24 hours, was applied by coating. The photomask was heated at 120° C. for 20 minutes, whereby a primer layer having thickness of 0.1 $\mu$m was formed.

| <Composition of the coating solution for primer layer> | |
| --- | --- |
| 0.1 N hydrochloric acid (aq) | 50 g |
| Tetramethoxysilane | 100 g |

Next, an inorganic coating agent for photocatalyst (ST-K01, manufactured by Ishihara Sangyo) was applied by coating on the primer layer. The photomask was then heated at 150° C. for 20 minutes such that a photocatalyst-containing layer having thickness of 0.15 $\mu$m was formed, whereby a photomask containing the photocatalyst (the photocatalyst-containing-layer side substrate) was formed.

Further next, a coating solution for fluorine-based silicone, which had been prepared by mixing the components of the composition described below and stirring the mixture at 25° C. for 24 hours, was applied by coating on a glass substrate. The glass substrate was then dried at 120° C. for 15 minutes, whereby a characteristic-modifiable layer having thickness of 0.05 $\mu$m was formed.

| <Composition of the coating solution for fluorine-based silicone > | |
| --- | --- |
| 0.2 N hydrochloric acid (aq) | 25 g |
| Fluoroalkylsilane | 15 g |
| Tetramethoxysilane | 50 g |

The photomask and the substrate for a pattern-formed structure obtained as described above were closely attached to each other and ultraviolet was irradiated by an extra-high pressure mercury lamp at the illumination intensity of 20 mW/cm$^2$ (365 nm) from the photomask side, whereby a wetting-property based pattern was formed at the surface of the characteristic-modifiable layer. Here, the contact angle formed by water at the unexposed portion of the characteristic-modifiable layer was 106° and it took 120 seconds for the contact angle formed by water at the exposed portion of the characteristic-modifiable layer to decrease to 10° or smaller. The width of the unexposed portion at the characteristic-modifiable layer surface was 49 $\mu$m and the width of the exposed portion at the characteristic-modifiable layer surface was 51 $\mu$m.

Reference Example

A pattern formation was carried out in the substantially same manner as that of example 5, except that a photomask containing the photocatalyst was formed without including a primer layer. As a result, it took 240 seconds for the contact angle formed by water at the exposed portion of the characteristic-modifiable layer to decrease to 10° or smaller. The width of the unexposed portion at the characteristic-modifiable layer surface was 40 $\mu$m and the width of the exposed portion at the characteristic-modifiable layer surface was 60 $\mu$m.

Example 6

On a photomask made of quartz glass including a pattern as a chrome-made light-shielding portion, of 0.4 $\mu$m thickness and 50 $\mu$m line-and-space, formed in the photomask, a coating solution for primer layer, which had been prepared by mixing the components of the composition described below and stirring the mixture at 25° C. for 24 hours, was applied by coating. The photomask was heated at 120° C. for 20 minutes, whereby a primer layer having thickness of 0.1 $\mu$m was formed.

| <Composition of the coating solution for primer layer> | |
| --- | --- |
| 0.1 N hydrochloric acid (aq) | 50 g |
| Tetramethoxysilane | 100 g |

Next, an inorganic coating agent for photocatalyst (ST-K03, manufactured by Ishihara Sangyo) was applied by coating on the primer layer. The photomask was then heated at 150° C. for 20 minutes such that a photocatalyst-containing layer having thickness of 0.15 $\mu$m was formed, whereby a photomask containing the photocatalyst (the photocatalyst-containing-layer side substrate) was formed.

Further next, a coating solution for fluorine-based silicone, which had been prepared by mixing the components of the composition described below and stirring the mixture at 25° C. for 24 hours, was applied by coating on a glass substrate of 370×470 mm. The glass substrate was then heated at 120° C. for 15 minutes, whereby a characteristic-modifiable layer having thickness of 0.05 $\mu$m was formed.

| <Composition of the coating solution for fluorine-based silicone > | |
| --- | --- |
| 0.2 N hydrochloric acid (aq) | 25 g |
| Fluoroalkylsilane | 15 g |
| Tetramethoxysilane | 50 g |

The photomask and the substrate for a pattern-formed structure prepared as described above were closely attached to each other so as to have a gap of 60 $\mu$m therebetween by using a large-size automatic exposure device (MA-6000 series, manufactured by Dainippon KaKen Co., Ltd.). Ultraviolet was irradiated at the illumination intensity of 20 mW/cm$^2$ (365 nm) from the photomask side, whereby a wetting-property based pattern was formed at the surface of the characteristic-modifiable layer. Here, the gaps actually measured at four sites between the photomask and the substrate for a pattern-formed structure were all within a range of 53 to 64 $\mu$m. The contact angle formed by a wetting property standard reagent (40 mN/m) at the unexposed portion of the wetting-property-modifiable layer was 75° and it took 150 seconds for the contact angle formed by the wetting property standard reagent (40 mN/m) at the exposed portion of the characteristic-modifiable layer to decrease to 9° or smaller. The width of the unexposed portion at the wetting-property-modifiable layer surface was 49 $\mu$m and the width of the exposed portion at the wetting-property-modifiable layer surface was 51 $\mu$m.

Example 7

A pattern formation was carried out in the substantially same manner as that of example 6, except that the gap between the photomask and the substrate for a pattern-formed structure was set at 150 $\mu$m. Here, the gaps actually measured at four sites between the photomask and the substrate for a pattern-formed structure were all within a range of 145 to 152 $\mu$m. As a result, it took 230 seconds for the contact angle formed by the wetting property standard reagent (40 mN/m) at the exposed portion of the characteristic-modifiable layer to decrease to 9° or smaller.

The width of the unexposed portion at the wetting-property-modifiable layer surface was 47 μm and the width of the exposed portion at the wetting-property-modifiable layer surface was 53 μm.

Comparative Example 1

A pattern formation was carried out in the substantially same manner as that of example 6, except that the gap between the photomask and the substrate for a pattern-formed structure was set at 250 μm. As a result, it took 360 seconds for the contact angle formed by the wetting property standard reagent (40 mN/m) at the exposed portion of the characteristic-modifiable layer to decrease to 9° or smaller. The width of the unexposed portion at the wetting-property-modifiable layer surface was 15 μm and the width of the exposed portion at the wetting-property-modifiable layer surface was 85 μm.

Comparative Example 2

A pattern formation was carried out in the substantially same manner as that of example 6, except that the gap between the photomask and the substrate for a pattern-formed structure was set at 5 μm. In this case, the photocatalyst-containing layer and the characteristic-modifiable layer were in contact with each other at some portions. As a result, there was generated unevenness in the degree of modification of the wetting property in the characteristic-modifiable layer, whereby a unique pattern was not be obtained.

Example 8

On a photomask made of quartz glass including a pattern as a chrome-made light-shielding portion, of 0.4 μm thickness and 50 μm line-and-space, formed in the photomask, a coating solution for primer layer, which had been prepared by mixing the components of the composition described below and stirring the mixture at 25° C. for 24 hours, was applied by coating. The photomask was heated at 120° C. for 20 minutes, whereby a primer layer having thickness of 0.1 μm was formed.

| <Composition of the coating solution for primer layer> | |
| --- | --- |
| 0.1 N hydrochloric acid (aq) | 50 g |
| Tetramethoxysilane | 100 g |

Next, an inorganic coating agent for photocatalyst (ST-K03, manufactured by Ishihara Sangyo) was applied by coating on the primer layer. The photomask was then heated at 150° C. for 20 minutes such that a photocatalyst-containing layer having thickness of 0.15 μm was formed, whereby a photomask containing the photocatalyst (the photocatalyst-containing-layer side substrate) was formed.

Further next, a substrate formed by vapor-depositing gold on a glass substrate was immersed for 24 hours in a Self-Assembled Film composition which had been prepared by dissolving octadecanethiol in hexane, whereby a decomposable and removable layer was formed on the glass substrate by way of gold.

The photomask and the substrate for a pattern-formed structure prepared as described above were closely attached to each other and ultraviolet was irradiated by an extra-high pressure mercury lamp at the illumination intensity of 20 mW/cm² (365 nm) from the photomask side, whereby a wetting-property based pattern was formed at the surface of the characteristic-modifiable layer. Here, it took 150 seconds for the Self-Assembled Film to be decomposed and removed. The width of the unexposed portion at the characteristic-modifiable layer surface was 49 μm and the width of the exposed portion at the characteristic-modifiable layer surface was 51 μm.

What is claimed is:

1. A method of producing a pattern-formed structure, comprising the processes of:

preparing a substrate for a pattern-formed structure having a characteristic-modifiable layer whose characteristic at a surface thereof can be modified by the action of photocatalyst;

arranging the substrate for a pattern-formed structure and a photocatalyst-containing-layer side substrate having a photocatalyst-containing layer formed on a base material, the photocatalyst-containing layer containing photocatalyst, such that the characteristic-modifiable layer faces the photocatalyst-containing layer with a gap of no larger than 200 μm therebetween; and irradiating energy to the characteristic-modifiable layer from a predetermined direction, and modifying characteristic of a surface of the characteristic-modifiable layer, thereby forming a pattern at the characteristic-modifiable layer.

2. A method of producing a pattern-formed structure according to claim 1, wherein the photocatalyst-containing layer and the characteristic-modifiable layer are disposed such that the gap therebetween is in a range of 0.2 μm to 10 μm.

3. A method of producing a pattern-formed structure according to claim 1, wherein the photocatalyst-containing-layer side substrate comprises the base material and a photocatalyst-containing layer formed, in a pattern-like configuration, on the base material.

4. A method of producing a pattern-formed structure according to claim 1, wherein the photocatalyst-containing-layer side substrate comprises the base material, the photocatalyst-containing layer formed on the base material, and a light-shielding portion formed in a pattern-like configuration, and the irradiation of energy at the pattern forming process is carried out from the photocatalyst-containing-layer side substrate.

5. A method of producing a pattern-formed structure according to claim 4, wherein, in the photocatalyst-containing-layer side substrate, the light-shielding portion is formed, in a pattern-configuration, on the base material and the photocatalyst-containing layer is formed on the light-shielding portion and the base material.

6. A method of producing a pattern-formed structure according to claim 4, wherein, in the photocatalyst-containing-layer side substrate, the photocatalyst-containing layer is formed on the base material and the light-shielding portion is formed, in a pattern-configuration, on the photocatalyst-containing layer.

7. A method of producing a pattern-formed structure according to claim 2, wherein, in the photocatalyst-containing-layer side substrate, a spacer having thickness in a range of 0.2 μm to 10 μm is formed, in a pattern-like configuration, on the photocatalyst-containing layer and exposure is effected in a state in which the spacer is in contact with the characteristic-modifiable layer.

8. A method of producing a pattern-formed structure according to claim 7, wherein the spacer is a light-shielding portion made of a light-shielding material.

9. A method of producing a pattern-formed structure, comprising the process of:

arranging a photocatalyst-containing-layer side substrate in which a photocatalyst-containing layer is formed on a photomask by way of a primer layer, the photomask being formed by providing a light-shielding portion, in a pattern-like configuration, on a transparent base material, and a substrate for a pattern-formed structure having a characteristic-modifiable layer whose characteristic can be modified by the action of photocatalyst contained at least in the photocatalyst-containing layer: such that the characteristic-modifiable layer faces the photocatalyst-containing layer with a gap therebetween, the gap being narrow enough to allow the action of the photo-catalyst of the photocatalyst-containing layer to have an effect on the characteristic-modifiable layer;

effecting irradiation of energy to the substrates, thereby modifying characteristic of the irradiated portion of the characteristic-modifiable layer; and removing the photocatalyst-containing-layer side substrate, thereby obtaining a pattern-formed structure.

10. A method of producing a pattern-formed structure according to claim 9, wherein the gap which is narrow enough to allow the action of the photo-catalyst of the photocatalyst-containing layer to have an effect on the characteristic-modifiable layer is in a range of 0.2 µm to 10 µm.

11. A method of producing a pattern-formed structure according to claim 1, wherein the photocatalyst-containing layer is a layer made of photocatalyst.

12. A method of producing a pattern-formed structure according to claim 11, wherein the photocatalyst-containing layer is a layer formed by providing a photocatalyst in a form of a film on a base material by a vacuum film making method.

13. A method of producing a pattern-formed structure according to claim 1, wherein the photo catalyst-containing layer is a layer containing a photocatalyst and a binder.

14. A method of producing a pattern-formed structure according to claim 1, wherein the photo catalyst is at least one type of compound selected from the group consisting of titanium oxide ($TiO_2$), zinc oxide (ZnO), tin oxide ($SnO_2$), strontium titanate ($SrTiO_3$), tungsten oxide ($WO_3$), bismuth oxide ($Bi_2O_3$), and iron oxide ($Fe_2O_3$).

15. A method of producing a pattern-formed structure according to claim 14, wherein the photocatalyst is titanium oxide ($TiO_2$).

16. A method of producing a pattern-formed structure according to claim 1, wherein the substrate for a pattern-formed structure is constituted, at least, of a substrate and the characteristic-modifiable layer provided on said substrate.

17. A method of producing a pattern-formed structure according to claim 16, wherein the characteristic-modifiable layer is a wetting-property-modifiable layer whose wetting property can be modified, such that a contact angle formed by a liquid on said wetting-property-modifiable layer is decreased upon irradiation of energy, by the action of the photocatalyst in the photocatalyst-containing layer.

18. A method of producing a pattern-formed structure according to claim 17, wherein the contact angle formed on said wetting-property-modifiable layer by a liquid whose surface tension is 40 mN/m is no smaller than 10° at an unexposed portion of the layer and no larger than 9° at an exposed portion.

19. A method of producing a pattern-formed structure according to claim 17, wherein said wetting-property-modifiable layer is a layer containing organopolysiloxane.

20. A method of producing a pattern-formed structure according to claim 19, wherein the organopolysiloxane is a polysiloxane containing the fluoroalkyl group.

21. A method of producing a pattern-formed structure according to claim 19, wherein the organopolysiloxane is an organopolysiloxane obtained as a result of hydrolysis condensation or cohydrolysis condensation of at least one type of silicon compound generally represented by a formula $Y_nSiX_{(4-n)}$, wherein Y represents a group selected from the group consisting of the alkyl group, the fluoroalkyl group, the vinyl group, the amino group, the phenyl group and the epoxy group, X represents the alkoxyl group or the halogen group, and n represents an integer of 0 to 3.

22. A method of producing a pattern-formed structure according to claim 1, wherein the substrate for a pattern-formed structure is a self-supporting film, and at least one surface thereof is a film-like wetting-property-modifiable layer whose wetting property can be modified, such that a contact angle formed by a liquid on said wetting-property-modifiable layer is decreased upon irradiation of energy, by the action of the photocatalyst in the photocatalyst-containing layer.

23. A method of producing a pattern-formed structure according to claim 16, wherein the characteristic-modifiable layer is a decomposable and removable layer which is decomposed and removed by the action of the photocatalyst contained in the photocatalyst-containing layer.

24. A method of producing a pattern-formed structure according to claim 23, wherein a contact angle formed by a liquid on the decomposable and removable layer is different from a contact angle formed by the liquid on the substrate which has been exposed as a result of decomposition and removal of the decomposable and removable layer.

25. A method of producing a pattern-formed structure according to claim 23, wherein the decomposable and removable layer is selected from the group consisting of a Self-Assembled Monolayer Film, a Langmuir-Blodgettts Film and a Layer-by-Layer Self-Assembled Film.

26. A method of producing a pattern-formed structure according to claim 1, wherein the irradiation of energy is carried out when the photocatalyst-containing layer is being heated.

* * * * *